United States Patent
Kim et al.

(10) Patent No.: US 12,446,432 B2
(45) Date of Patent: Oct. 14, 2025

(54) DISPLAY PANEL, PRODUCTION METHOD THEREOF, AND DISPLAY DEVICE INCLUDING THE SAME

(71) Applicant: SAMSUNG ELECTRONICS CO., LTD., Suwon-si (KR)

(72) Inventors: Yongwook Kim, Suwon-si (KR); Ji-Yeong Kim, Suwon-si (KR); Soo Kyung Kwon, Suwon-si (KR); Eun Joo Jang, Suwon-si (KR); Sungwoo Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 480 days.

(21) Appl. No.: 18/091,879

(22) Filed: Dec. 30, 2022

(65) Prior Publication Data

US 2023/0217775 A1   Jul. 6, 2023

(30) Foreign Application Priority Data

Dec. 30, 2021   (KR) .................. 10-2021-0193409

(51) Int. Cl.
*H10K 59/38* (2023.01)
*H10H 20/01* (2025.01)
(Continued)

(52) U.S. Cl.
CPC ............. *H10K 59/38* (2023.02); *H10K 59/12* (2023.02); *H10K 2102/331* (2023.02)

(58) Field of Classification Search
CPC ...... H10K 59/38; H10K 59/351; H10K 59/12; H10K 2102/331; H10H 20/8513
See application file for complete search history.

(56) References Cited

U.S. PATENT DOCUMENTS

| | | |
|---|---|---|
| 8,125,137 B2 | 2/2012 | Medendorp, Jr. et al. |
| 8,410,680 B2 | 4/2013 | Medendorp, Jr. et al. |

(Continued)

FOREIGN PATENT DOCUMENTS

| | | |
|---|---|---|
| JP | 5091000 | 9/2012 |
| JP | 202068207 | 4/2020 |

(Continued)

OTHER PUBLICATIONS

Extended European Search Report -European Application No. 22217318.9 dated Jun. 27, 2023, citing references listed within.

(Continued)

*Primary Examiner* — Mohsen Ahmadi
(74) *Attorney, Agent, or Firm* — CANTOR COLBURN LLP

(57) ABSTRACT

A display panel includes a light emitting panel and a color conversion panel. The color conversion layer emits a predetermined light. A color of the predetermined light comprises a first region of Cx of about 0.26 to about 0.35 and Cy of about 0.27 to about 0.35 in CIE 1931 color coordinates, and in an emission spectrum of the predetermined light having a color in the first region, a first area percentage is less than or equal to about 65%, where the first area percentage is defined by the following formula: [A/B]× 100%, in which A denotes an area of a region having a wavelength of less than or equal to about 470 nm in the emission spectrum, and B denotes an area of a region having a wavelength of less than or equal to about 480 nm in the emission spectrum.

20 Claims, 26 Drawing Sheets

(51) Int. Cl.
    *H10H 20/851*     (2025.01)
    *H10K 59/12*     (2023.01)
    *H10K 59/35*     (2023.01)
    *H10K 102/00*     (2023.01)

(56) References Cited

U.S. PATENT DOCUMENTS

| | | |
|---|---|---|
| 8,847,478 B2 | 9/2014 | Medendorp, Jr. et al. |
| 10,872,931 B2 | 12/2020 | Kim et al. |
| 2007/0023734 A1 | 2/2007 | Igarashi et al. |
| 2007/0223219 A1 | 9/2007 | Medendorp, Jr. et al. |
| 2009/0147501 A1* | 6/2009 | Chang .............. G02F 1/133603 362/97.3 |
| 2010/0245396 A1* | 9/2010 | Huang ................ G09G 3/3426 345/88 |
| 2011/0050125 A1 | 3/2011 | Medendorp, Jr. et al. |
| 2011/0148743 A1* | 6/2011 | Kuo .................. G02F 1/136286 345/55 |
| 2013/0249434 A1 | 9/2013 | Medendorp, Jr. et al. |
| 2014/0240612 A1* | 8/2014 | Gotou ...................... H04N 9/30 362/613 |
| 2018/0158884 A1* | 6/2018 | Lee ..................... H10K 50/167 |
| 2019/0214420 A1* | 7/2019 | Kim .................... H10F 39/8057 |
| 2019/0296088 A1 | 9/2019 | Kim et al. |
| 2020/0124781 A1 | 4/2020 | Tseng et al. |
| 2020/0365650 A1* | 11/2020 | Pei ....................... H10H 20/856 |
| 2021/0097943 A1 | 4/2021 | Wyatt |
| 2021/0115333 A1* | 4/2021 | Min ..................... H10K 50/115 |
| 2021/0202585 A1* | 7/2021 | Chen .................... H10K 59/878 |
| 2021/0284908 A1 | 9/2021 | Kim et al. |
| 2022/0119706 A1* | 4/2022 | Kwon ............... G02F 1/133617 |
| 2022/0149251 A1* | 5/2022 | Park ................... H10H 20/8515 |
| 2022/0179139 A1* | 6/2022 | Kim ...................... C09K 11/883 |
| 2022/0246804 A1* | 8/2022 | Park .................... C09K 11/883 |

FOREIGN PATENT DOCUMENTS

| | | |
|---|---|---|
| KR | 1020190110660 | 10/2019 |
| KR | 1020210014568 | 2/2021 |
| KR | 1020210115612 | 9/2021 |

OTHER PUBLICATIONS

Hee Chang Yoon, et al., "Study of Perovskite QD Down-Converted LEDs and Six-Color White LEDs for Future Displays with Excellent Color Performance", ACS Appl. Mater. Interfaces, (2016), vol. 8, pp. 18189-18200.

Joon-Suh Park, et al., "Alternative Patterning Process for Realization of Large-Area, Full-Color, Active Quantum Dot Display", Nano Lett., (2016), vol. 16, pp. 6946-6953.

\* cited by examiner

DISPLAY PANEL, PRODUCTION METHOD THEREOF, AND DISPLAY DEVICE INCLUDING THE SAME

CROSS-REFERENCE TO RELATED APPLICATION

This application claims priority to Korean Patent Application No. 10-2021-0193409, filed on Dec. 30, 2021, and all the benefits accruing therefrom under 35 U.S.C. § 119, the content of which in its entirety is herein incorporated by reference.

BACKGROUND

1. Field

The disclosure relates to a display panel and an electronic device including the display panel.

2. Description of the Related Art

A display panel may be included in various electronic devices. Nanostructures such as quantum dots may be utilized as a light emitting material in such a display panel and may contribute to improvement of display quality.

SUMMARY

An embodiment provides a display panel.

An embodiment provides an electronic device (e.g., display device) including the display panel.

According to an embodiment, a display panel includes a light emitting panel and a color conversion panel, In such an embodiment, the color conversion panel includes a color conversion layer including a plurality of color regions, and a partition wall which defines the plurality of color regions, In such an embodiment, the light emitting panel provides incident light to each of the plurality of color regions, In such an embodiment, the plurality of color regions includes a first color region, a second color region, a third color region, and a fourth color region, In such an embodiment, the first color region includes a first composite including a first matrix and first semiconductor nanoparticles dispersed in the first matrix, where the first semiconductor nanoparticles convert the incident light into a first light, In such an embodiment, the second color region includes a second composite including a second matrix and second semiconductor nanoparticles dispersed in the second matrix, where the second semiconductor nanoparticles convert the incident light into a second light, In such an embodiment, the third color region includes a third composite including a third matrix and third semiconductor nanoparticles dispersed in the third matrix, where the third semiconductor nanoparticles convert the incident light into a third light, In such an embodiment, the fourth color region emits a fourth light, In such an embodiment, the first semiconductor nanoparticles, the second semiconductor nanoparticles, and the third semiconductor nanoparticles do not include cadmium, lead, or a combination thereof, In such an embodiment, an emission peak wavelength of the first light is greater than or equal to about 600 nm and less than or equal to about 650 nm, In such an embodiment, an emission peak wavelength of the second light is greater than or equal to about 500 nm and less than or equal to about 560 nm, In such an embodiment, an emission peak wavelength of the third light is greater than about 470 nm and less than about 500 nm, In such an embodiment, an emission peak wavelength of the fourth light is greater than or equal to about 440 nm and less than or equal to about 470 nm, In such an embodiment, the color conversion layer emits a predetermined light, In such an embodiment, a color of the predetermined light includes a first region of Cx of about 0.26 to about 0.35 and Cy of about 0.27 to about 0.35 in CIE 1931 color coordinates, and In such an embodiment, in an emission spectrum of the predetermined light having a color in the first region, a first area percentage is less than or equal to about 65%, where the first area percentage is defined by the following formula: [A/B]×100%, where A denotes an area of a region having a wavelength of less than or equal to about 470 nm in the emission spectrum, and B denotes an area of a region having a wavelength of less than or equal to about 480 nm in the emission spectrum.

In an embodiment, the first area percentage may be less than or equal to about 55%, less than or equal to about 53%, or less than or equal to about 50%.

In an embodiment, in the emission spectrum of the predetermined light having the color in the first region, a second area percentage may be less than or equal to about 19%, where the second area percentage is defined by the following formula: [A/C]×100%, where A denotes an area of a region having a wavelength of less than or equal to about 470 nm in the emission spectrum, and C denotes a total area of the emission spectrum.

In an embodiment, the second area percentage may be less than or equal to about 18%, less than or equal to about 17%, less than or equal to about 16%, less than or equal to about 15%, or less than or equal to about 14%.

In an embodiment, the second area percentage may be greater than or equal to about 0.1%, greater than or equal to about 1%, greater than or equal to about 2%, greater than or equal to about 3%, greater than or equal to about 4%, or greater than or equal to about 5%.

In an embodiment, a partition wall may be disposed between adjacent color regions.

In such an embodiment, the partition wall may optically separate (or isolate) the adjacent color regions.

In an embodiment, the emission peak wavelength of the third light may be greater than or equal to about 475 nm, or greater than or equal to about 479 nm.

In an embodiment, the emission peak wavelength of the third light may be less than or equal to about 485 nm or less than or equal to about 482 nm.

In an embodiment, the emission peak wavelength of the fourth light may be less than or equal to about 468 nm, or less than or equal to about 465 nm.

In an embodiment, the emission peak wavelength of the fourth light may be greater than or equal to about 450 nm, or greater than or equal to about 455 nm.

In an embodiment, a difference between the emission peak wavelength of the third light and the emission peak wavelength of the fourth light may be less than or equal to about 39 nm, less than or equal to about 35 nm, or less than or equal to about 30 nm.

In an embodiment, the emission peak wavelength of the third light may be greater than or equal to about 475 nm and less than or equal to about 485 nm, the emission peak wavelength of the fourth light may be greater than or equal to about 455 nm and less than or equal to about 465 nm, and a difference between the emission peak wavelength of the third light and the emission peak wavelength of the fourth light may be less than or equal to about 30 nm.

In an embodiment, the difference between the emission peak wavelength of the third light and the emission peak wavelength of the fourth light may be less than or equal to about 25 nm.

In an embodiment, a difference between the emission peak wavelength of the fourth light and the emission peak wavelength of the incident light may be less than or equal to about 10 nm. In such an embodiment, the difference between the emission peak wavelength of the fourth light and the emission peak wavelength of the incident light may be less than or equal to about 5 nm.

In an embodiment, the emission peak wavelength of the fourth light may be substantially the same as the emission peak wavelength of the incident light.

In an embodiment, in the first region, Cx may be about 0.27 to about 0.32 or about 0.28 to about 0.31, and Cy may be about 0.28 to about 0.33 or about 0.29 to about 0.32.

In an embodiment, a full width at half maximum of the first light may be greater than or equal to about 5 nm and less than or equal to about 45 nm. In such an embodiment, a full width at half maximum of the second light may be greater than or equal to about 5 nm and less than or equal to about 45 nm. In such an embodiment, a full width at half maximum of the third light may be greater than or equal to about 5 nm and less than or equal to about 45 nm.

In an embodiment, a luminance intensity at an intersection of a normalized emission spectrum of the third light and a normalized emission spectrum of the second light may be less than or equal to about 0.5.

In an embodiment, a luminance intensity at an intersection of the normalized emission spectrum of the third light and the normalized emission spectrum of the second light may be less than or equal to about 0.4.

In such an embodiment, an emission spectrum of the color conversion layer may not exhibit an additional emission peak (e.g., an emission peak of a fifth light), for example the additional emission peak having a full width at half maximum of greater than or equal to about 5 nm and less than or equal to about 50 nm), and a emission peak wavelength of the additional emission peak being in a range of greater than about 580 nm and less than about 600 nm.

In an embodiment, a color of the predetermined light of the color conversion layer may include a second region (e.g., bluish green) of Cx of about 0.18 (or about 0.19) to about 0.20 and Cy of about 0.38 to about 0.41 in CIE 1931 color coordinates.

In an emission spectrum of the predetermined light having a color in the second region, the first area percentage may be less than or equal to about 65%, or less than or equal to about 60%, or less than or equal to about 55% and greater than or equal to about 1% or greater than or equal to about 5%. In the emission spectrum of the predetermined light having a color in the second region, the second area percentage may be less than or equal to about 18% less than or equal to about 15%, or less than or equal to about 11% and greater than or equal to about 1% or greater than or equal to about 5%.

In an embodiment, a color of the predetermined light of the color conversion layer may include a third region (e.g., magenta) of Cx of about 0.39 to about 0.41 and Cy of about 0.19 to about 0.21 in CIE 1931 color coordinates, and in an emission spectrum of the predetermined light having a color in the third region, the first area percentage may be less than or equal to about 80%, less than or equal to about 75%, or less than or equal to about 70% and greater than or equal to about 10% or greater than or equal to about 15%. In the emission spectrum of the predetermined light having the color in the third region, the second area percentage may be less than or equal to about 18%, less than or equal to about 15.5%, or less than or equal to about 14% and greater than or equal to about 1%, greater than or equal to about 5%, or greater than or equal to about 10%.

In an embodiment, the first semiconductor nanoparticles, the second semiconductor nanoparticles, and the third semiconductor nanoparticles may include each independently, a Group II-VI compound, a Group III-V compound, a Group IV-VI compound, a Group IV element or compound, a Group compound, a Group I-II-IV-VI compound, or a combination thereof.

In an embodiment, the fourth region may include a fourth composite.

In an embodiment, the fourth composite may or may not include luminescent nanoparticles.

In an embodiment, the first composite, the second composite, the third composite, the fourth composite, or a combination thereof may further include metal oxide particulates (which may be referred to as "metal oxide particle," at times herein).

In an embodiment, the metal oxide particulates may be non-luminescent.

In an embodiment, the light emitting panel may include a plurality of light emitting units.

In an embodiment, the plurality of light emitting units may include a first light emitting unit, a second light emitting unit, a third light emitting unit, a fourth light emitting unit, or a combination thereof. In such an embodiment, the first light emitting unit, the second light emitting unit, the third light emitting unit, or the fourth light emitting unit may provide incident light to the first color region, the second color region, the third color region, or the fourth color region, respectively. In such an embodiment, the plurality of light emitting units may be spaced apart from each other.

In an embodiment, the light emitting panel may further include a partition wall disposed between the plurality of light emitting units, optionally.

In an embodiment, the plurality of light emitting units may include an organic light emitting diode (OLED), a micro light emitting diode, an inorganic nano light emitting diode, or a combination thereof.

In an embodiment, an electronic device (e.g., a display device) includes the display panel. The electronic device (or the display device) may include a portable terminal device, a monitor, a note PC, a television, an electric sign board, a camera, an electronic component for a vehicle, or a combination thereof.

The display panel according to an embodiment may provide an improved picture quality or a high-quality screen image while using light that is safer for human eyes.

DETAILED DESCRIPTION

Figure 1A:
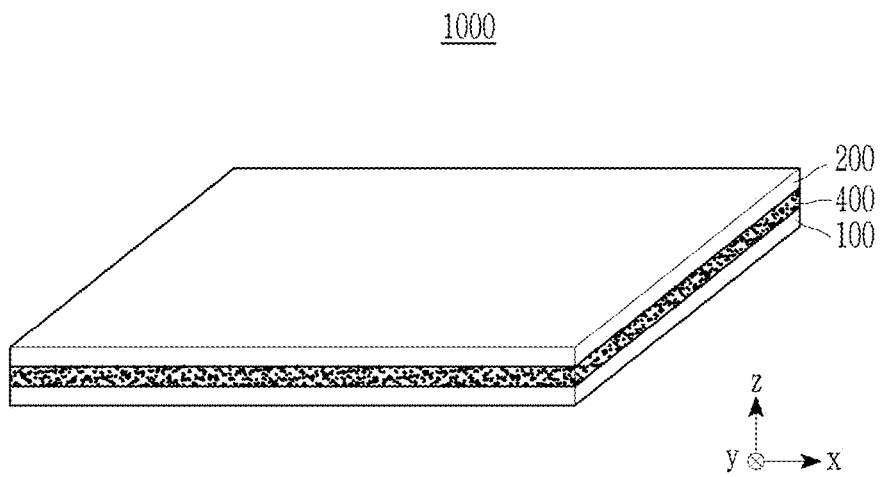
FIG. 1A is a perspective view illustrating a display panel according to an embodiment.

Hereinafter, various embodiments of the present disclosure will be described in detail with reference to the accompanying drawings so that those of ordinary skill in the art may easily implement the present disclosure. The present disclosure may be implemented in various different forms and is not limited to the embodiments described herein. The drawings and description are to be regarded as illustrative in nature and not restrictive. Like reference numerals designate like elements throughout the specification.

The size and thickness of each constituent element as shown in the drawings are randomly indicated for better understanding and ease of description, and this disclosure is not necessarily limited to as shown. In the drawings, the thickness of layers, films, panels, regions, etc., are exaggerated for clarity. In addition, in the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means being disposed on or below the object portion, and does not necessarily mean being disposed on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as being limited to "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In an embodiment, when it is referred to as "planar", it may mean when the target portion is viewed from above. In an embodiment, "cross-sectional" may mean a cross-section that is substantially or approximately perpendicular to a reference plane (e.g., a bottom surface of a panel) of the target portion. Unless otherwise stated, numerical ranges stated herein are inclusive.

Unless otherwise stated, the words "substantially" or "approximately" or "about" are omitted before values in the numerical ranges specified herein. As used herein, "substantially" or "approximately" or "about" means not only the stated value, but also the mean within an acceptable range of deviations, considering the errors associated with the corresponding measurement and the measurement of the measured value. For example, "substantially" or "approximately" can mean within ±10%, 5%, 3%, or 1% or within standard deviation of the stated value.

Herein, a nanostructure refers to a structure having at least one region or a characteristic dimension with a nanoscale dimension. In an embodiment, the dimension of the nanoparticle may be less than about 300 nm, less than about 250 nm, less than about 150 nm, less than about 100 nm, less than about 50 nm, or less than about 30 nm. These structures may have any shape. Unless otherwise specified herein, the nanoparticles or semiconductor nanoparticles may have any shape, such as nanowires, nanorods, nanotubes, multi-pod type shapes having two or more pods, nanodots (or quantum dots), etc. and are not particularly limited. The nanoparticles may be, for example, substantially crystalline, substantially monocrystalline, polycrystalline, amorphous, or a combination thereof. For example, semiconductor nanoparticles such as quantum dots may exhibit quantum confinement or exciton confinement. In the present specification, the term "nanoparticles or quantum dots" are not limited in their shapes unless specifically defined. Semiconductor nanoparticles, such as quantum dots, may have a size smaller than a diameter of Bohr excitation in the bulk crystal of the same material, and may exhibit a quantum confinement effect. Semiconductor nanoparticles may emit light corresponding to their bandgap energy by controlling the size of the emission center of the nanocrystals. In an embodiment, "cross-sectional image" may be obtained by cutting across the major axis or minor axis on the plane of the target portion.

"Aperture ratio (%)" may mean a transparent region (e.g., the ratio of the light-sensitive area of the pixel to the total area of the corresponding pixel) in pixel design. A light extraction surface of a light emitting unit refers to a surface of the light emitting unit configured to emit light (see FIGS. 1B and 4A). When viewed from the cross-section of the panel according to an embodiment, the light extraction surface may be substantially perpendicular to a propagation direction of light and/or may be substantially horizontal or parallel to a bottom surface of the panel, but is not limited thereto.

In an embodiment, a width of the color conversion region may be an interval between sidewalls constituting the partition wall.

As used herein, "combination" may include a (e.g., homogeneous or heterogeneous) mixture, an alloy, or two or more stacked structures.

As used herein, an emission peak wavelength may refer to the wavelength where an emission spectrum (e.g., a radiometric emission spectrum) of a given light or a given light source reaches its maximum.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
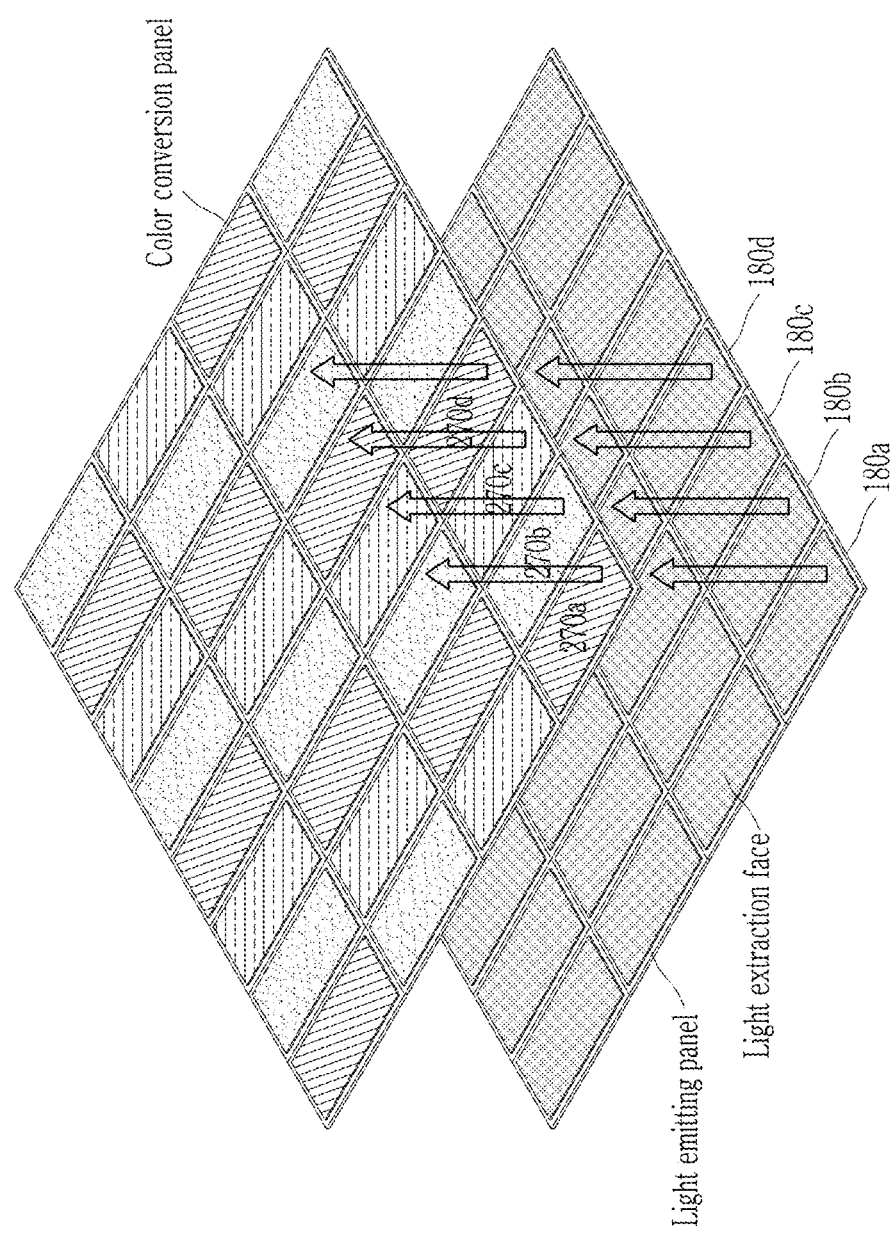
FIG. 1B is an exploded perspective view showing a display panel according to an embodiment.
Figure 2:
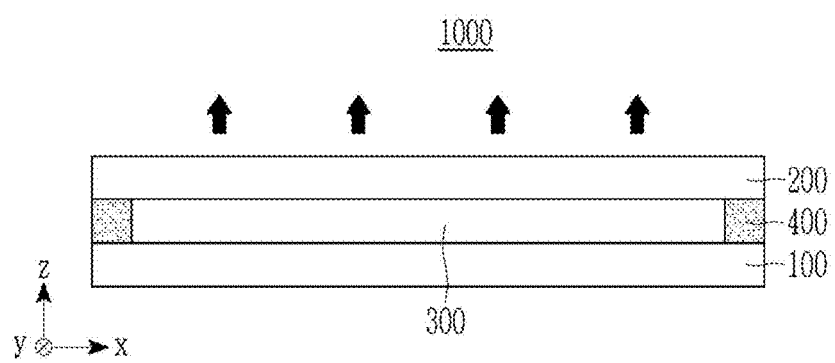
FIG. 2 is a cross-sectional view of the display panel of FIG. 1A.
Figure 3:
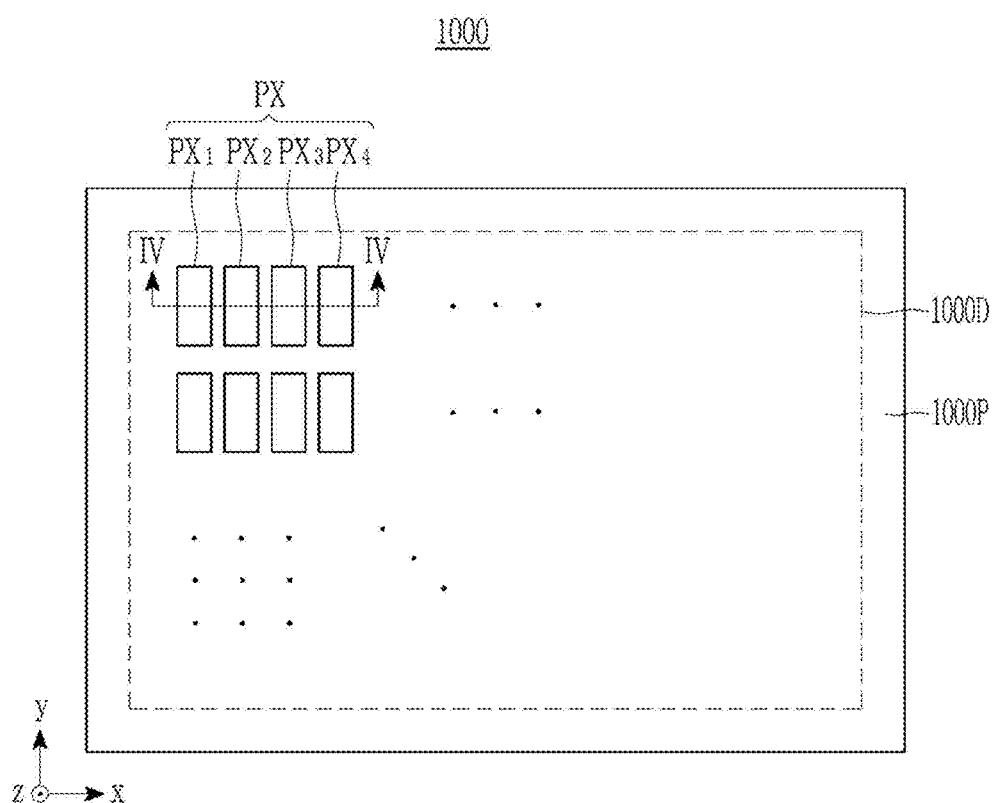
FIG. 3 is a plan view illustrating an embodiment of a pixel arrangement of the display panel of FIG. 1A.
Figure 4A:
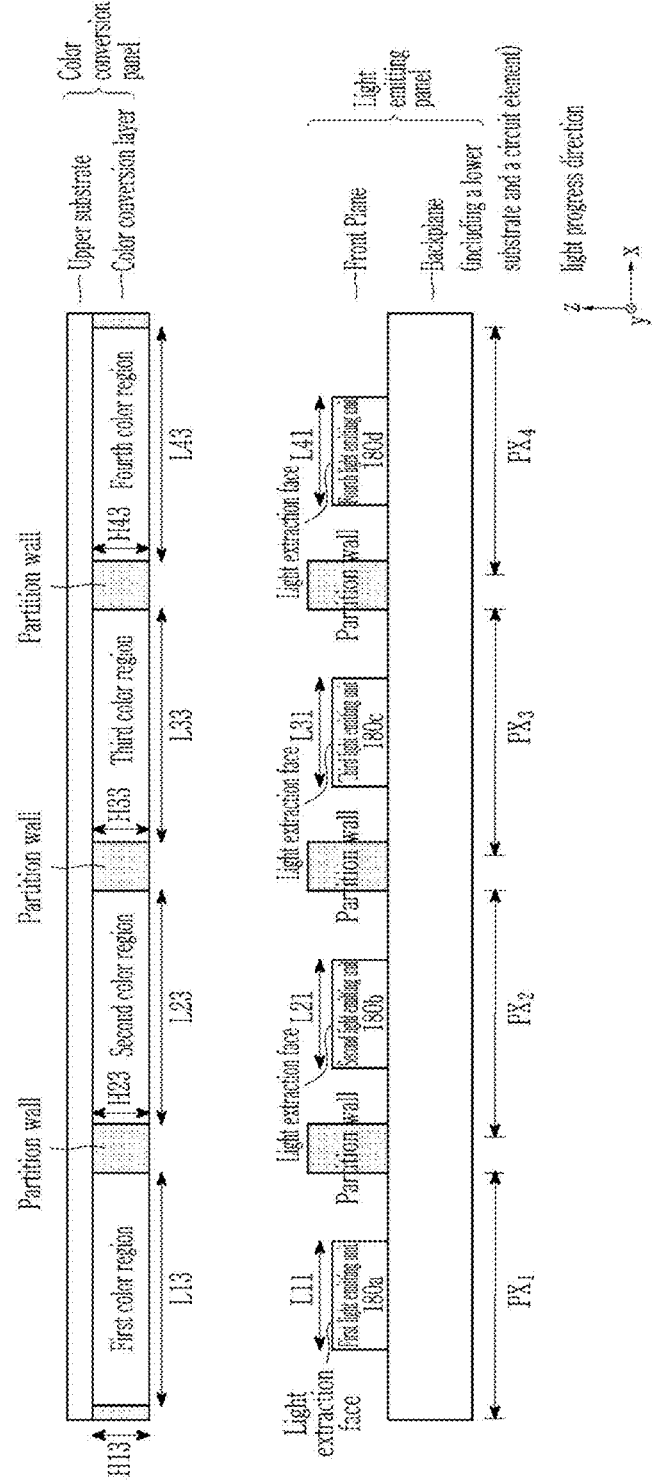
FIG. 4A is a cross-sectional view of the display panel of FIG. 3 taken along line IV-IV.
Figure 4B:
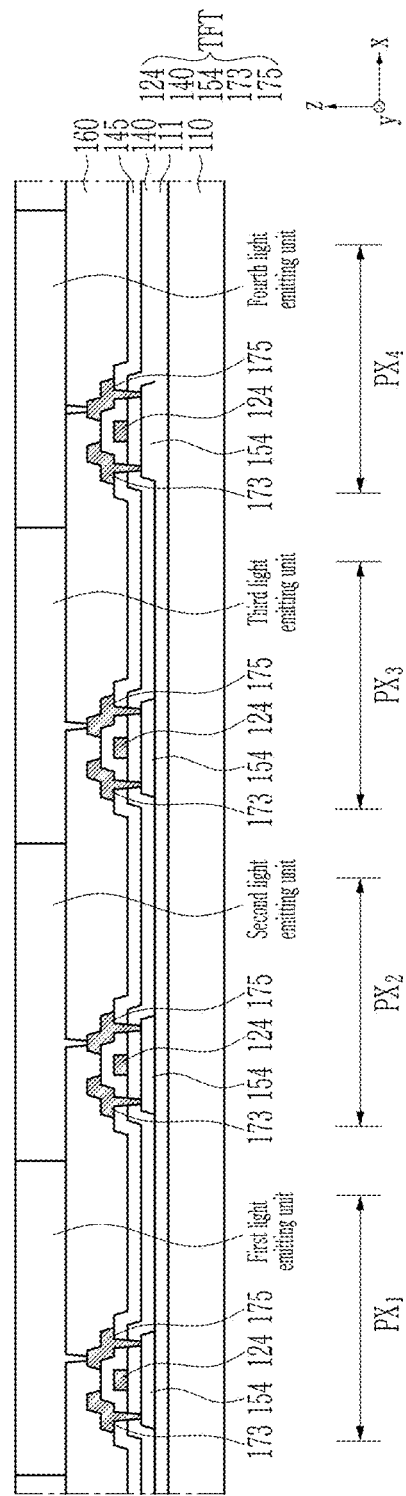
FIG. 4B is a cross-sectional view showing an embodiment of the backplane in FIG. 4A in more detail.
Figure 4C:
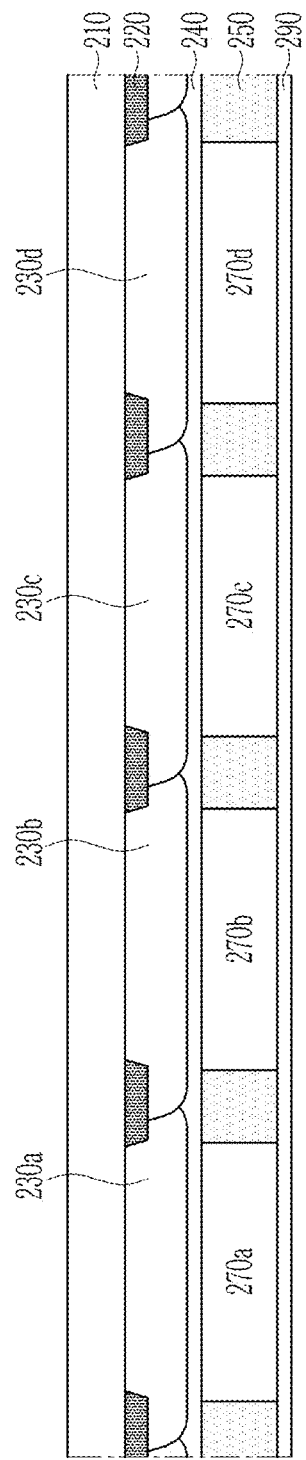
FIG. 4C is a schematic cross-sectional view showing the color conversion panel of FIG. 4A in more detail.
Figure 4D:
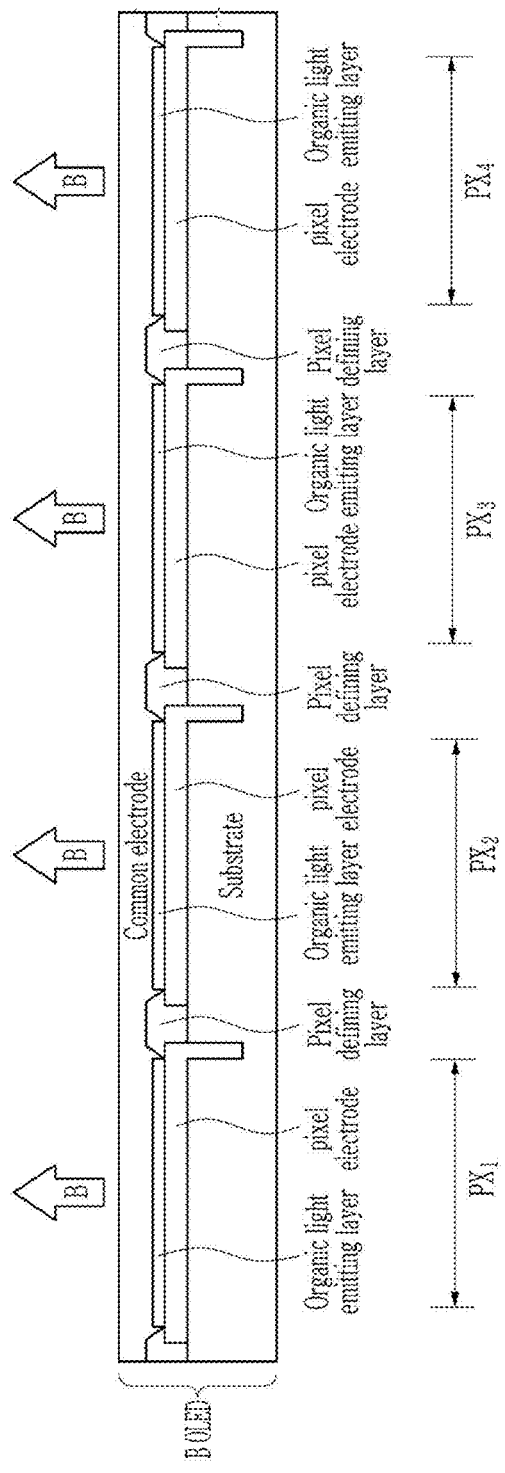
FIG. 4D is a schematic cross-sectional view illustrating a case in which the light emitting panel includes an organic light emitting diode in FIG. 4A, FIGS. 5 to 6 are cross-sectional views each showing embodiments of a light emitting unit.

FIGS. 1A and 1B are a perspective view and a perspective exploded view of a display panel according to an embodiment, FIG. 2 is a cross-sectional view of the display panel of FIG. 1A, FIG. 3 is a plan view illustrating an embodiment of a pixel arrangement of the display panel of FIG. 1A, FIG. 4A is a diagram schematically illustrating a cross-section of the display panel of FIG. 3 taken along line IV-IV, FIG. 4B is a cross-sectional view showing an embodiment of the backplane in FIG. 4A in more detail, FIG. 4C is a schematic cross-sectional view showing the color conversion panel in FIG. 4A in more detail, and FIG. 4D is a schematic cross-sectional view illustrating a case in which the light emitting panel includes an organic light emitting diode in FIG. 4A.

Referring to FIGS. 1A, 1B, and 2, a display panel 1000 according to an embodiment includes a light emitting panel 100 and a color conversion panel 200. In an embodiment, as shown in FIG. 2, the display panel includes a light transmitting layer 300 between the light emitting panel 100 and the color conversion panel 200, a binder 400 coupling the light emitting panel 100 and the color conversion panel 200 to each other, or a combination thereof. In an embodiment, the light transmitting layer 300 may be, for example, a filler, and may include, for example, an organic material, an inorganic material, an organic-inorganic material, or a combination thereof, for example, an epoxy resin, a silicone compound, a polyorganosiloxane, or a combination thereof. However, the disclosure is not limited thereto. In an embodiment, the light emitting panel 100 and the color conversion panel 200 face each other (with the light transmitting layer 300 disposed therebetween), and the color conversion panel 200 is disposed in a direction in which light is emitted from the light emitting panel 100 (or in a direction in which light propagates). In the display panel according to an embodiment, an arrangement method of the binder is not particularly limited. In an embodiment, the binder 400 may be disposed along the edges of the light emitting panel 100 and the color conversion panel 200. The binder 400 may be, for example, a sealing material. In the display panel according to an embodiment, the binder 400 may be bonded by an adhesive such as an optically clear adhesive (OCA) disposed on at least a portion of the surface of the light emitting panel and at least a portion of the surface of the color conversion panel.

Referring to FIG. 3, the display panel 1000 according to an embodiment includes a display area 1000D for displaying an image and a non-display area 1000P around the display area 1000D and in which the binder 400 is disposed. The display area 1000D includes a plurality of pixels PX or color conversion layers arranged along a row (e.g., x direction) and/or column (e.g., y direction), and each pixel PX or color conversion layer includes a plurality of color regions or subpixels $PX_1$, $PX_2$, $PX_3$, and $PX_4$ that display different colors from each other. In this specification, the terms pixel and color conversion layer are used interchangeably. In an embodiment, as shown in FIG. 3, four subpixels $PX_1$, $PX_2$, $PX_3$, and $PX_4$ may form or collectively define one pixel PX, but the disclosure is not limited thereto. Alternatively, the color conversion layer may further include an additional subpixel such as a white subpixel or one or more subpixels for displaying a same color. The plurality of pixels PX may be arranged, for example, in a Bayer matrix form, a PenTile® matrix form, and/or a diamond matrix form, but is not limited thereto.

A partition wall may be disposed between the plurality of color regions. The partition wall may define a color region. In the display panel of an embodiment, light coupling between color regions (e.g., light coupling such that the second light or the third light is incident on the first color region and is converted into light having a different emission spectrum, or vice versa) in the color conversion layer may be substantially suppressed or effectively prevented (e.g., by the presence of such partition walls). The partition wall may provide substantial optical isolation to adjacent color regions. Details of the partition wall are the same described herein.

The plurality of color regions may include a first color region or a first subpixel $PX_1$, a second color region or a second subpixel $PX_2$, a third color region or a third subpixel $PX_3$, and a fourth color region or a fourth subpixel $PX_4$. In an embodiment, the first color region may display red, the second color region may display green, the third color region may display cyan, and the fourth color region may display blue. In this specification, a subpixel is a term used interchangeably with a color region. In an embodiment of the color conversion panel, the first, second, third, and fourth lights emitted from each color region are emitted from the panel as emitted light of the color conversion layer without further conversion by semiconductor nanoparticles present in adjacent regions.

Although the drawing illustrates an embodiment in which all subpixels have the same size, the disclosure is not limited thereto, and at least one selected from the subpixels may be larger or smaller than the other subpixels.

Although the drawing illustrates an embodiment in which all subpixels have the same shape, the disclosure is not limited thereto, and at least one of the subpixels may have a different shape from other subpixels.

A size of the pixel PX may be selected appropriately and is not particularly limited. A dimension (a pixel width and/or length) of a pixel may be greater than or equal to about 100 µm, greater than or equal to about 150 µm, greater than or equal to about 200 µm, greater than or equal to about 250 µm, greater than or equal to about 300 µm, greater than or equal to about 350 µm, greater than or equal to about 400 µm, greater than or equal to about 450 µm, greater than or equal to about 500 µm, greater than or equal to about 550 µm, greater than or equal to about 600 µm, greater than or equal to about 650 µm, greater than or equal to about 700 µm, greater than or equal to about 750 µm, greater than or equal to about 800 µm, or greater than or equal to about 850 µm. The dimension (pixel width and/or length) of the pixel may be less than or equal to about 2000 µm, less than or equal to about 1500 µm, less than or equal to about 1000 µm, or less than or equal to about 500 µm.

In an embodiment, the light emitting panel may include a plurality of light emitting units. The plurality of light emitting units may include a first light emitting unit, a second light emitting unit, a third light emitting unit, a fourth light emitting unit, or a combination thereof. The first light emitting unit, the second light emitting unit, the third light emitting unit, or the fourth light emitting unit may be configured to provide incident light to the first color region, the second color region, the third color region, or the fourth color region, respectively. The plurality of light emitting units may be spaced apart from each other.

The light emitting panel 100 and the color conversion panel 200 will hereinafter be described sequentially with reference to FIGS. 4A, 4B, and 5.

In an embodiment, the light emitting panel 100 may include a plurality of light emitting units 180 that emit light of a predetermined wavelength region. The light emitting units (the first light emitting unit 180a, the second light emitting unit 180b, the third light emitting unit 180c, and the fourth light emitting unit 180d) may be arranged to correspond to each color region $PX_1$, $PX_2$, $PX_3$, and $PX_4$. In an embodiment, as shown in FIG. 4A, the plurality of light emitting units may be disposed on a light emitting surface (e.g., on a backplane or in a front plane) of the light emitting panel. The light emitting surface or front plane of the light emitting panel faces the color conversion panel. In an embodiment, the light emitting panel may include a backplane opposite to the front plane. Light is emitted from the light extraction surface (also referred to as light extraction face at times) of the light emitting unit, and the emitted light may propagate in the z direction (see FIGS. 4A, 4B, and 4D).

Each of the plurality of light emitting units 180a, 180b, 180c, and 180d may be the same as or different from each other. In an embodiment, the light emitting unit 180a, 180b, 180c, and 180d disposed corresponding to the color regions $PX_1$, $PX_2$, $PX_3$, and $PX_4$ may emit light of different emission spectra, respectively. In an embodiment, the light emitting units 180a, 180b, 180c, and 180d disposed corresponding to the subpixels $PX_1$, $PX_2$, $PX_3$, and $PX_4$ may emit light having a same emission spectrum as each other.

The plurality of light emitting units 180a, 180b, 180c, and 180d may emit incident light. In an embodiment, the emission peak wavelength of the incident light may be greater than or equal to about 360 nm, greater than or equal to about 400 nm, greater than or equal to about 440 nm, greater than or equal to about 445 nm, greater than or equal to about 450 nm, greater than or equal to about 455 nm, or greater than or equal to about 458 nm. The emission peak wavelength of the incident light may be less than or equal to about 490 nm, less than or equal to about 485 nm, less than or equal to about 480 nm, less than or equal to about 475 nm, less than or equal to about 470 nm, less than or equal to about 465 nm, less than or equal to about 460 nm, less than or equal to about 455 nm, less than or equal to about 450 nm, or less than or equal to about 445 nm.

In an embodiment, each of the light emitting units may emit light having a blue emission spectrum, and the emission peak wavelengths of the blue emission spectrum may be about 410 nm to about 495 nm, about 420 nm to about 490 m, about 425 nm to about 485 m, about 430 nm to about 480 nm, about 440 nm to about 470 nm, or a combination thereof.

The emission peak wavelength of the incident light may be appropriately selected in consideration of the desired emission intensity of the emission unit, the semiconductor nanoparticles included in the color conversion panel, the aperture ratio, and the like. In an embodiment, the incident light may be substantially the same as the fourth light emitted from the fourth region.

In an embodiment, the plurality of light emitting units in the light emitting panel may be arranged in an array form. (See FIG. 1B)

In an embodiment, dimensions (or widths or lengths) L11, L21, L31, and L41 of the light extraction surface of the light emitting unit (e.g., the first light emitting unit 180a, the second light emitting unit 180b, the third light emitting unit 180c, the fourth light emitting unit 180d, hereinafter, abbreviated as a light emitting unit) (e.g., when viewed from the cross-section of the panel) may be greater than or equal to about 500 nm, greater than or equal to about 900 nm, greater than or equal to about 1 micrometer (µm), greater than or equal to about 1.5 µm, greater than or equal to about 2 µm, greater than or equal to about 2.5 µm, greater than or equal to about 3 µm, greater than or equal to about 3.5 µm, greater than or equal to about 4 µm, greater than or equal to about 4.5 µm, greater than or equal to about 5 µm, greater than or equal to about 5.5 µm, greater than or equal to about 6 µm, greater than or equal to about 6.5 µm, greater than or equal to about 7 µm, greater than or equal to about 7.5 µm, greater than or equal to about 8 µm, greater than or equal to about 8.5 µm, greater than or equal to about 9 µm, greater than or equal to about 9.5 µm, greater than or equal to about 10 µm, greater than or equal to about 13 µm, greater than or equal to about 15 µm, greater than or equal to about 17 µm, greater than or equal to about 19 µm, greater than or equal to about 20 µm, greater than or equal to about 21 µm, greater than or equal to about 24 µm, greater than or equal to about 25 µm, greater than or equal to about 27 µm, greater than or equal to about 29 µm, greater than or equal to about 30 µm, greater than or equal to about 31 µm, greater than or equal to about 33 µm, greater than or equal to about 35 µm, greater than or equal to about 37 µm, greater than or equal to about 39 µm, greater than or equal to about 40 µm, greater than or equal to about 41 µm, greater than or equal to about 43 µm, greater than or equal to about 45 µm, greater than or equal to about 47 µm, greater than or equal to about 49 µm, greater than or equal to about 50 µm, greater than or equal to about 70 µm, greater than or equal to about 100 µm, greater than or equal to about 200 µm, greater than or equal to about 300 µm, greater than or equal to about 500 µm, greater than or equal to about 700 µm, greater than or equal to about 900 µm, or greater than or equal to about 1000 µm.

In an embodiment, a length of the light extraction surface may be the longest length of a straight line parallel (or horizontal) to the bottom surface of the panel in the corresponding cross section, but is not limited thereto. The length of the light extraction surface may be a dimension of the light emitting surface of the corresponding light emitting unit (e.g., the diameter of the light emitting surface or the length of one side). In an embodiment where the light emitting unit is a micro light emitting diode (LED) or quantum nano-emitting diode (QNED), the size of the light emitting surface may be determined in consideration of a desired resolution (pixel per inch, PPI) of the display panel.

In an embodiment, a length of the light extraction surface in the light emitting unit or a size of the light emission surface of the light emitting unit (hereinafter referred to as individual light source dimensions), for example, dimensions of the light extraction surfaces L11, L21, L31, and L41, may be less than or equal to about 2000 micrometers (µm), for example, less than or equal to about 1500 µm, less than or equal to about 1000 µm, less than or equal to about 500 µm, less than or equal to about 100 micrometer, less than or equal to about 90 µm, less than or equal to about 85 µm, less than or equal to about 80 µm, less than or equal to about 75 µm, less than or equal to about 70 µm, less than or equal to about 65 µm, less than or equal to about 60 µm, less than or equal to about 55 µm, less than or equal to about 50 µm, less than or equal to about 45 µm, less than or equal to about 40 µm, less than or equal to about 35 µm, less than or equal to about 30 µm, less than or equal to about 25 µm, less than or equal to about 20 µm, less than or equal to about 15 µm, less than or equal to about 10 µm, or less than or equal to about 5 µm.

The light emitting units may be spaced apart from each other, and an interval between adjacent light emitting units may be adjusted in consideration of the pixel size, subpixel size, and the like, and is not particularly limited.

The light extraction surface of the light emitting unit (e.g., planar or top view of an individual light source) may have any shape and is not particularly limited. The light extraction surface may have a polygonal shape, such as a triangle, a quadrilateral, or a pentagon, a circle, an ellipse, or any shape.

The vertical cross section of the light emitting unit may have any shape and is not particularly limited. The cross-sectional shape of the light emitting unit may be, but is not limited to, a square, a right-angled rectangle, a trapezoid, a rhombus, a parallelogram, and the like.

In an embodiment, each of the light emitting units (e.g., the first light emitting unit and the second light emitting unit) included in the light emitting panel may be spaced apart from each other.

A partition wall (e.g., a passivation layer or a bank layer) or a pixel defining layer may be disposed between the first light emitting unit and the second light emitting unit. The partition walls may be arranged to overlap at least a portion of the partition walls disposed on the color conversion panel, as will be described later, when viewed from a cross-section of the panel. The material of the partition wall, the passivation layer, or the bank layer may include an organic material, an inorganic material, or a combination thereof, and is not particularly limited. For the material of the partition wall, reference may be made to the description in this specification.

Referring to FIG. 4B, the backplane of the light emitting panel may include, for example, a lower substrate 110 and a circuit element for switching and/or driving the light emitting units. In an embodiment, the light emitting units may be individually (e.g., independently) controlled.

The lower substrate 110 may be a glass substrate, an organic-inorganic hybrid substrate, a metal substrate, a polymer substrate, or a combination thereof. The substrate may include an insulating material. The substrate may include glass; various polymers such as polyimide, polyamide, polyamideimide, polyester such as polyethylene terephthalate (PET) or polyethylene naphthalate (PEN), polycarbonate, or polyacrylate; polysiloxanes (e.g., PDMS); inorganic materials such as $Al_2O_3$ and ZnO; or a combination thereof, but is not limited thereto. A thickness of the substrate may be appropriately selected in consideration of the substrate material and the like, and is not particularly limited. The substrate may be flexible.

A buffer layer 111 may be disposed on the lower substrate 110. The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer or two or more layers, and may cover the whole surface of the lower substrate 110. The buffer layer 111 may be omitted.

A thin film transistor TFT may be disposed on the buffer layer 111. The thin film transistor TFT may be a three-terminal element for switching and/or driving the light emitting unit 180, which will be described later, and one or two or more may be included for each subpixel. The thin film transistor TFT may include a gate electrode 124, a semiconductor layer 154 overlapping (or disposed to overlap) the gate electrode 124, a gate insulating layer 140 between the gate electrode 124 and the semiconductor layer 154, and a source electrode 173 and a drain electrode 175 electrically connected to the semiconductor layer 154.

In an embodiment, as shown in FIG. 4B, the thin film transistor TFT may have a coplanar top gate structure, but the structure is not limited thereto and may have various structures. The gate electrode 124 is electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. In an embodiment, for example, the semiconductor layer 154 may include an oxide semiconductor including at least one selected from indium (In), zinc (Zn), tin (Sn), and gallium (Ga), and the oxide semiconductor may include, for example, indium-gallium-zinc oxide, zinc-tin oxide, or a combination thereof, but they are not limited thereto. The semiconductor layer 154 may include a channel region and doped regions disposed on both sides of the channel region and electrically connected to the source electrode 173 and the drain electrode 175, respectively.

The gate insulating layer 140 may be disposed on the buffer layer 111 to cover the semiconductor layer 154. The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In an embodiment, as shown in FIG. 4B, the gate insulating layer 140 is formed on the whole surface of the lower substrate 110, but the disclosure is not limited thereto and, alternatively, may be optionally or partially formed between the gate electrode 124 and the semiconductor layer 154. The gate insulating layer 140 may be formed of (or defined by) one or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting unit 180 to be described later. An interlayer insulating layer 145 is additionally formed between the gate electrode 124 and the source/drain electrodes 173 and 175.

The interlayer insulating layer 145 may include an organic material, an inorganic material, or an organic-inorganic material, for example, oxide, nitride, or oxynitride, for example, silicon oxide, silicon nitride, silicon oxynitride, or a combination thereof, but is not limited thereto. The interlayer insulating layer 145 may be formed of one or two or more layers.

A protective layer 160 may be disposed on the thin film transistor TFT. The protective layer 160 may be, for example, a passivation layer. The protective layer 160 may include an organic material, an inorganic material, or an organic-inorganic material, for example, polyacrylic, polyimide, polyamide, polyamideimide, or a combination thereof, but is not limited thereto. The protective layer 160 may be formed of one or two or more layers.

In an embodiment, the plurality of light emitting units may be disposed corresponding to each of subpixels $PX_1$, $PX_2$, $PX_3$, and $PX_4$, and the light emitting units disposed corresponding to each of subpixels $PX_1$, $PX_2$, $PX_3$, and $PX_4$ are driven independently. The light emitting units may include an organic light emitting diode (OLED). The light emitting units may include an inorganic light emitting diode. The inorganic light emitting diode may include, but is not limited to, a micro LED, an inorganic nano light emitting diode, or a combination thereof. In an embodiment, each light emitting unit 180 may be an OLED, a quantum dot light emitting diode, a perovskite light emitting diode, or a micro LED.

Figure 5:
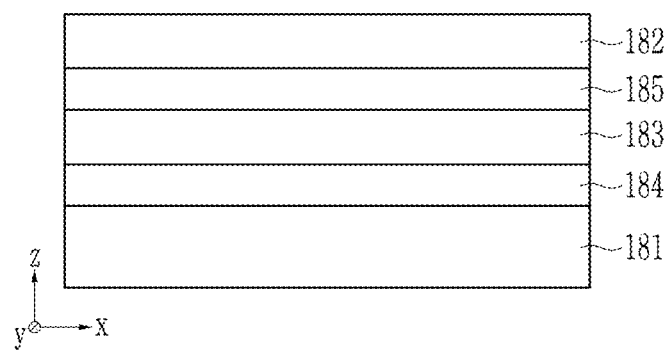
Figure 6:
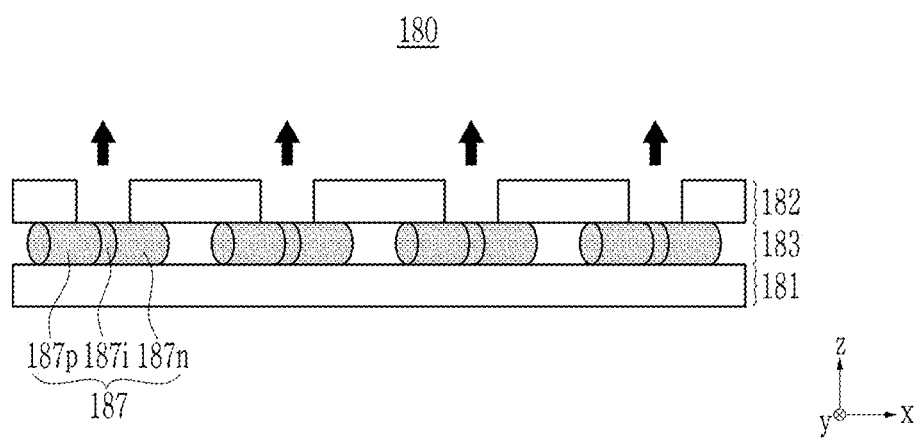

FIGS. 5 and 6 are cross-sectional views schematically illustrating embodiments of a light emitting unit.

In an embodiment, referring to FIG. 5, the light emitting unit 180 includes a first electrode 181 and a second electrode 182 spaced apart from each other; a light emitting layer 183 is electrically connected to each of the first electrode 181 and the second electrode 182. In an embodiment, the first electrode and the second electrode may be disposed to face each other. In an embodiment, the light emitting layer 183 may be disposed between the first electrode 181 and the second electrode 182 (for example, facing each other). In an embodiment, the first electrode 181 and the second electrode 182 may be disposed to face each other along the thickness direction (e.g., z direction), but the present disclosure is not limited thereto. One of the first electrode 181 and the second electrode 182 may be an anode and the other may be a cathode. The first electrode 181 may be a light transmitting electrode, a translucent electrode, or a reflective electrode, and the second electrode 182 may be a light transmitting electrode or a translucent electrode. The light transmitting electrode or translucent electrode may be, for example, made of a thin single layer or multiple layers of metal thin film including conductive oxides such as indium tin oxide (ITO), indium zinc oxide (IZO), zinc oxide (ZnO), tin oxide (SnO), aluminum tin oxide (AlTO), and fluorine-doped tin oxide (FTO) or silver (Ag), copper (Cu), aluminum (Al), magnesium (Mg), magnesium-silver (Mg—Ag), magnesium-aluminum (Mg—Al), or a combination thereof. The reflective electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto. In an embodiment, the light emitting layer 183 may include an inorganic light emitting body or material, and the inorganic light emitting body or material may include an inorganic semiconductor, quantum dots, perovskite, or a combination thereof. In an embodiment, the light emitting layer or the inorganic light emitting material may be a p-n diode including an n-doped layer, a p-doped layer, and an active layer (e.g., a quantum well layer) disposed between the n- and p-doped layers. In an embodiment, the front surface (or the top surface) of the p-n diode layer may correspond to the aforementioned light extraction surface. The p-n diode layer may include one or more layers based on a Group II-VI material (e.g., ZnSe) or a Group III-V material. The Group III-V material may include a Group III-V nitride material (e.g., GaN, AlN, InN, InGaN, and an alloy thereof), a Group III-V phosphide materials (e.g., GaP, AlGaInP, and an alloy thereof), and a Group III-V arsenide alloy (AlGaAs). The p-n diode layer may include indium gallium nitride (InGaN), gallium nitride (GaN), aluminum gallium nitride, gallium phosphide (GaP), aluminum gallium indium phosphide (AlGaInP), aluminum gallium phosphide (AlGaP), zinc selenide (ZnSe), or a combination thereof, which may be p-doped or n-doped, respectively. In an embodiment, the p-n diode layer is designed to emit blue light, and the materials may include a nitride series. In an embodiment, the materials forming the p-n diode layer may include GaN, AlGaN, InGaN, or a combination thereof. In an embodiment, the n-doped layer may include n-GaN, n-AlGaN, n-InGaN, n-AlGaInP, or a combination thereof, and the p-doped layer may include p-AlGaN, p-GaN, p-InGaN, p-AlGaInP, or a combination thereof, but they are not limited thereto. The quantum well layer may include various materials. The quantum well layer may be a single quantum well (SQW) or multiple quantum well (MQW) layer. The number of quantum well layers may be 1 or more and 10 or less, or 3 or more and 8 or less. A thickness of each layer may be appropriately selected and is not particularly limited. The light emitting unit may further include auxiliary layers 184 and 185 between the first electrode 181 and the light emitting layer 183 and between the second electrode 182 and the light emitting layer 183, respectively. The auxiliary layers 184 and 185 may include a charge injection layer and/or a charge transport layer for controlling mobility. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. At least one selected from the auxiliary layers 184 and 185 may be omitted. In another embodiment, the light emitting layer may include a light emitting body (e.g., an organic compound) capable of emitting incident light.

FIG. 4D is a schematic cross-sectional view of a light emitting panel of an embodiment including an organic light emitting diode.

Referring to FIG. 4D, an embodiment of the light emitting panel may include two or more pixel electrodes formed on a substrate, a pixel defining layer between neighboring pixel electrodes, an organic light emitting layer on each pixel electrode, and a common electrode layer on the organic light emitting layer. A thin film transistor and a substrate may be disposed under the organic light emitting diode. The substrate is substantially the same as that described above.

A wiring layer including a thin film transistor or the like is formed on the substrate. The wiring layer may further include a gate line, a sustain voltage line, a gate insulating layer, a data line, a source electrode, a drain electrode, a semiconductor layer, a protective layer, and the like. The detailed structure of the wiring layer may vary according to embodiments. The gate line and the sustain voltage line are electrically isolated from each other, and the data line is insulated from and crosses the gate line and the sustain voltage line.

The gate electrode, the source electrode, and the drain electrode constitute a control terminal, an input terminal, and an output terminal of the thin film transistor, respectively. The drain electrode is electrically connected to a pixel electrode to be described later.

The pixel electrode may function as an electrode (e.g., an anode) of the display device. The pixel electrode may include or be formed of a transparent conductive material such as indium tin oxide (ITO) or indium zinc oxide (IZO). The pixel electrodes may include or be formed of a material having light blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layer structure in which the aforementioned transparent conductive material and the aforementioned light blocking material are sequentially stacked.

A pixel defining layer may be formed between two adjacent pixel electrodes, overlapping the end of the pixel electrode to divide the pixel electrodes into units of pixels. The pixel defining layer may be an insulating layer and may electrically block the two or more pixel electrodes. The pixel defining layer may cover only a portion of an upper surface of the pixel electrode, and the remaining portion of the pixel electrode not covered by the pixel defining layer may form an opening.

An organic light emitting layer, which will be described later, may be formed on the region defined by the opening. The organic light emitting layer is defined as each pixel area by the aforementioned pixel electrode and the pixel defining layer. That is, a region including one organic light emitting unit layer in contact with one pixel electrode divided by the pixel defining layer may be defined as one pixel region. In the light emitting panel of the display device according to the embodiment, the organic light emitting layer may correspond to a first light emitting unit, a second light emitting unit, a third light emitting unit, and a fourth light emitting unit, and each light emitting unit is spaced apart by a predetermined interval by a pixel defining layer. The organic light emitting layer may emit the aforementioned incident light. The organic light emitting layer may include an organic light emitting unit layer for each pixel area, and each organic light emitting unit layer may further include an auxiliary layer (e.g., a hole injection layer, a hole transport layer, an electron injection layer, an electron transport layer, etc.) in addition to the light emitting layer.

The common electrode may function as a cathode of the display device. The common electrode may be formed of a transparent conductive material such as indium tin oxide (ITO) or indium zinc oxide (IZO). The common electrode may be integrally formed on the organic light emitting layer.

A planarization layer or a passivation layer (not shown) may be formed on the common electrode. The planarization layer may include an insulating material (e.g., transparent) to ensure electrical insulation with the common electrode.

Referring to FIG. 6, the light emitting unit 180 includes a light emitting layer 183 including a first electrode 181, a second electrode 182, and a plurality of nanostructures 187. One of the first electrode 181 and the second electrode 182 may be an anode and the other may be a cathode. The first electrode 181 and the second electrode 182 may be electrodes patterned according to the arrangement direction of the plurality of nanostructures 187. Details of the first electrode and the second electrode are the same as those described herein.

The light emitting layer 183 may include a plurality of nanostructures 187, and each one may be arranged corresponding to the subpixels $PX_1$, $PX_2$, $PX_3$, and $PX_4$. The plurality of nanostructures 187 may be arranged in one direction, but is not limited thereto. The nanostructure 187 may be a compound semiconductor that emits light of a predetermined wavelength when an electric current is applied, and may be, for example, a linear nanostructure such as a nanorod or a nanoneedle. A diameter or major axis of the nanostructures 187 may be, for example, several to several hundreds of nanometers and an aspect ratio of the nanostructures 187 may be greater than about 1, greater than or equal to about 1.5, greater than or equal to about 2.0, greater than or equal to about 3.0, greater than or equal to about 3.5, or greater than or equal to about 4.0, greater than or equal to about 4.5, greater than or equal to about 5.0, greater than about 1 and less than or equal to about 20, about 1.5 to about 20, about 2.0 to about 20, about 3.0 to about 20, about 4.0 to about 20, about 4.5 to about 20, or about 5.0 to about 20. Each nanostructure 187 may include a p-type region 187p, an n-type region 187n, and a multiple quantum well region 187i, and light may be emitted from the multiple quantum well region 187i. The nanostructures 187 may include, for example, gallium nitride (GaN), indium gallium nitride (InGaN), aluminum gallium nitride (AlGaN), or a combination thereof, but are not limited thereto. The plurality of nanostructures 187 may emit incident light, and the details of the incident light is the same as described above.

In the display panel of an embodiment, the color conversion panel may include a first color region configured to emit a first light, a second color region configured to emit a second light, and a third color region configured to emit a third light, and a fourth color region configured to emit a fourth light.

Figure 7:
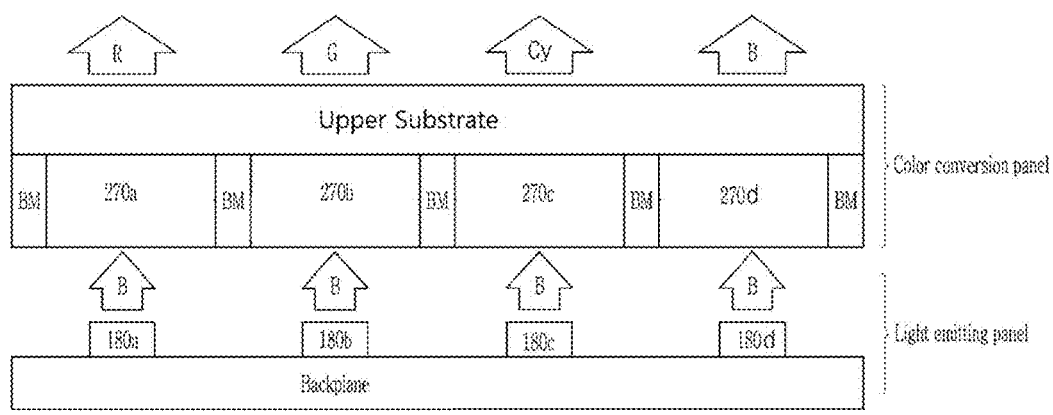
FIG. 7 is a schematic cross-sectional view of a display panel according to an embodiment.

FIG. 7 is a schematic cross-sectional view of a display panel according to an embodiment.

Referring to FIGS. 4A and 7, an embodiment of the color conversion panel 200 may convert the incident light (B in FIG. 7) provided from the light emitting panel 100 into light of different spectra (e.g., first light, second light, third light, and optionally a fourth light), and emit the same toward an observer (not shown). In an embodiment, the incident light (or fourth light) may be emitted toward an observer (not shown) as it is.

The plurality of color conversion regions may further include a partition wall 250 or BM disposed between adjacent color regions. The partition wall 250 or BM may optically separate (or isolate) the adjacent color regions. Optical separation or isolation is as described herein. The partition wall 250 or BM may include a material that blocks light in the corresponding color conversion region from propagating to another region. In an embodiment, the partition wall 250 or BM may include a material that absorbs or reflects a portion of light. The partition wall 250 or BM may include a light blocking member. In an embodiment, the partition wall 250 or BM may include a material (capable of blocking, for example, absorbing or reflecting light). The material of the partition wall 250 or BM may include a dye, a pigment, a reflective material, an absorbing material, or a combination thereof. The material of the partition wall 250 or BM is not particularly limited as long as it is a material capable of blocking desired light. The material of the partition wall 250 or BM may include one used as a material for a bank in a light emitting diode. In embodiments, the pigment may include, but is not limited to, a white pigment, a black pigment, a gray pigment, or a combination thereof. In an embodiment, the partition wall 250 or BM may be prepared from a photoresist composition (e.g., a composition for a black matrix, a composition for a gray matrix, a composition for a white matrix, etc.) including a desired pigment. A composition for a photoresist including a pigment may be commercially available or a known composition may be used.

Referring to FIGS. 4A and 4C, the color conversion layer may be disposed on the upper substrate 210. A light blocking pattern 220 corresponding to the partition wall may be disposed on the upper substrate 210. Color filter layers 230a, 230b, 230c, and 230d may be further provided between the color conversion layer 270 and the substrate 210.

The upper substrate 210 may be a substrate including an insulating material. The upper substrate 210 may include glass; various polymers such as polyester such as polyethylene terephthalate (PET) or polyethylene naphthalate (PEN), polycarbonate, or polyacrylate; polysiloxanes (e.g., PDMS); inorganic materials such as $Al_2O_3$ and ZnO; or a combination thereof, but is not limited thereto. A thickness of the upper substrate 210 may be appropriately selected in consideration of the substrate material and the like, and is not particularly limited. The upper substrate 210 may be flexible. The upper substrate 210 may be configured to have a transmittance of greater than or equal to about 50%, greater than or equal to about 60%, greater than or equal to about 70%, greater than or equal to about 80%, or greater than or equal to about 90% with respect to light emitted from the semiconductor nanoparticle(s) to be described later.

An emission peak wavelength of the first light may be greater than or equal to about 600 nm, greater than or equal to about 605 nm, greater than or equal to about 610 nm, or greater than or equal to about 615 nm and less than or equal to about 670 nm, less than or equal to about 650 nm, less than or equal to about 650 nm, less than or equal to about 645 nm, less than or equal to about 640 nm, less than or equal to about 635 nm, or less than or equal to about 630 nm.

An emission peak wavelength of the second light may be greater than or equal to about 500 nm, greater than or equal to about 505 nm, greater than or equal to about 510 nm, greater than or equal to about 515 nm, or greater than or equal to about 520 nm and less than or equal to about 565 nm, less than or equal to about 560 nm, less than or equal to about 550 nm, less than or equal to about 545 nm, less than or equal to about 540 nm, less than or equal to about 535 nm, less than or equal to about 530 nm, less than or equal to about 525 nm, less than or equal to about 515 nm, or less than or equal to about 510 nm.

An emission peak wavelength of the third light may be greater than about 470 nm, greater than or equal to about 473 nm, greater than or equal to about 475 nm, greater than or equal to about 477 nm, greater than or equal to about 479 nm, greater than or equal to about 480 nm, greater than or equal to about 482 nm, or greater than or equal to about 485 nm and less than about 500 nm, less than or equal to about 499 nm, less than or equal to about 495 nm, less than or equal to about 490 nm, or less than or equal to about 487 nm.

An emission peak wavelength of the fourth light may be greater than about 440 nm, greater than or equal to about 445 nm, greater than or equal to about 450 nm, greater than or equal to about 455 nm, greater than or equal to about 460 nm, or greater than or equal to about 465 nm and less than or equal to about 470 nm, less than or equal to about 468 nm, less than or equal to about 466 nm, less than or equal to about 464 nm, less than or equal to about 462 nm, less than or equal to about 460 m, or less than or equal to about 458 m.

The incident light may be a blue light (B) or a fourth light. The detailed features of the blue light are the same as those described herein. The wording "color region" may be used interchangeably with "color conversion region."

The first color (conversion) region 270a may include a first composite including a first matrix and first semiconductor nanoparticles dispersed in the first matrix, where the first semiconductor nanoparticles are configured to convert the incident light into the first light. The second color (conversion) region 270b may include a second composite including a second matrix and second semiconductor nanoparticles dispersed in the second matrix, where the second semiconductor nanoparticles are configured to convert the incident light into the second light. The third color (conversion) region 270c may include a third composite including a third matrix and third semiconductor nanoparticles dispersed in the third matrix, where the third semiconductor nanoparticles are configured to convert the incident light into the third light. In an embodiment, the fourth color region may optionally include a fourth matrix and is configured to emit a fourth light (e.g., by passing the incident light). The fourth color region may further include fourth semiconductor nanoparticles dispersed in the fourth matrix. The incident light provided to the fourth color region may include blue light or light having a wavelength in the ultraviolet region. The fourth color region may be configured to pass incident light that is blue light. The first, the second, the third and the fourth matrix may include or may be a polymer matrix.

A width L13 of the first color (conversion) region (e.g., first semiconductor nanoparticle-polymer composite), a width L23 of the second color (conversion) region (e.g., second semiconductor nanoparticle-polymer composite), a width L33 of the third color (conversion)/light transmitting region (e.g., the third semiconductor nanoparticle-polymer composite), or a width L43 of the fourth color region (or light transmitting region) are not particularly limited and may be appropriately selected.

In an embodiment, a width of the color region may be greater than or equal to about 1 μm, greater than or equal to about 3 μm, greater than or equal to about 5 μm, greater than or equal to about 7 μm, greater than or equal to about 9 μm, greater than or equal to about 11 μm, greater than or equal to about 15 μm, greater than or equal to about 20 μm, greater than or equal to about 25 μm, greater than or equal to about 30 μm, greater than or equal to about 35 μm, greater than or equal to about 40 μm, greater than or equal to about 45 μm, greater than or equal to about 50 μm, greater than or equal to about 60 μm, greater than or equal to about 70 μm, greater than or equal to about 80 μm, greater than or equal to about 90 μm, greater than or equal to about 100 μm, greater than or equal to about 130 μm, greater than or equal to about 150 μm, greater than or equal to about 170 μm, greater than or equal to about 190 μm, greater than or equal to about 200 μm, greater than or equal to about 230 μm, greater than or equal to about 250 μm, greater than or equal to about 270 μm, greater than or equal to about 290 μm, greater than or equal to about 300 μm, greater than or equal to about 330 μm, greater than or equal to about 350 μm, greater than or equal to about 370 μm, greater than or equal to about 390 μm, or greater than or equal to about 450 μm. In an embodiment, the width of the color region may be less than or equal to about 2000 μm, less than or equal to about 1000 μm, less than or equal to about 700 μm, less than or equal to about 650 μm, less than or equal to about 600 μm, less than or equal to about 550 μm, less than or equal to about 500 μm, less than or equal to about 450 μm, less than or equal to about 400 μm, less than or equal to about 350 μm, less than or equal to about 300 μm, less than or equal to about 250 μm, less than or equal to about 200 μm, less than or equal to about 180 μm, less than or equal to about 150 μm, less than or equal to about 130 μm, less than or equal to about 100 μm, less than or equal to about 90 μm, less than or equal to about 80 μm, less than or equal to about 70 μm, less than or equal to about 60 μm, less than or equal to about 50 μm, or less than or equal to about 40 μm.

In the cross-section of the display panel, the thicknesses H13, H23, H33, and H43 of the first color region, the second color region, the third color region, or the fourth color region (or the composite included therein) are not particularly limited, and may be appropriately selected. In the cross-section of the display panel, the thicknesses H13, H23, H33, and H43 of the color regions may, each independently, be greater than or equal to about 1 μm, greater than or equal to about 3 μm, greater than or equal to about 5 μm, greater than or equal to about 7 μm, greater than or equal to about 9 μm, greater than or equal to about 11 μm, greater than or equal to about 13 μm, greater than or equal to about 15 μm, greater than or equal to about 17 μm, or greater than or equal to about 19 μm. The thickness of the color conversion region may be less than or equal to about 30 μm, less than or equal to about 25 μm, or less than or equal to about 20 μm.

In the color conversion panel, the first semiconductor nanoparticles, the second semiconductor nanoparticles, and the third semiconductor nanoparticles do not contain cadmium, lead, or a combination thereof. In the color conversion region, the first semiconductor nanoparticle, the second semiconductor nanoparticle, and the third semiconductor nanoparticle are configured to convert the emission spectrum of the incident light supplied from the light emitting panel 100 to the first light, the second light, and the third light, respectively. The color conversion layer is configured to emit predetermined light (e.g., by any combination of light emitted from the first color region, the second color region, the third color region, and/or the fourth color region). The color conversion layer of an embodiment may achieve an increased color region compared to a color conversion panel based on three RGB subpixels.

In an embodiment, the color conversion panel may have a color region of greater than or equal to about 90%, greater than or equal to about 92%, greater than or equal to about 94%, or greater than or equal to about 95% under BT2020. The color gamut may be in a range from about 100 to 90%, about 99 to about 92%, about 98 to about 93%, about 97 to about 94%, or about 96 to about 95%, or a combination thereof.

The color of the predetermined light configured to be emitted by the color conversion layer of an embodiment may include a first region having a Cx of about 0.26 to about 0.35 and a Cy of about 0.27 to about 0.35 in CIE 1931 color coordinates.

In an emission spectrum of the predetermined light having a color in the first region, a first area percentage defined by the following Formula (1) is less than or equal to about 65%.

$$[A/B] \times 100\% \quad \text{Formula (1):}$$

In Formula (1), A denotes an area of a region having a wavelength of less than or equal to about 470 nm in the emission spectrum, and B denotes an area of a region having a wavelength of less than or equal to about 480 nm in the emission spectrum.

The first area percentage may be less than or equal to about 64%, less than or equal to about 63%, less than or equal to about 62%, less than or equal to about 61%, less than or equal to about 60%, less than or equal to about 59%, less than or equal to about 58%, less than or equal to about 57%, less than or equal to about 56%, less than or equal to about 55%, less than or equal to about 54%, less than or equal to about 53%, less than or equal to about 52%, less than or equal to about 51%, less than or equal to about 50%, less than or equal to about 49%, less than or equal to about 48%, less than or equal to about 47%, less than or equal to about 46%, less than or equal to about 45%, less than or equal to about 44%, less than or equal to about 43%, less than or equal to about 42%, less than or equal to about 41%, or less than or equal to about 40%. The first area percentage may be greater than or equal to about 0.1%, greater than or equal to about 0.5%, greater than or equal to about 1%, greater than or equal to about 2%, greater than or equal to about 3%, greater than or equal to about 4%, greater than or equal to about 5%, greater than or equal to about 6%, greater than or equal to about 7%, greater than or equal to about 8%, or greater than or equal to about 9%.

In the first region, the Cx may be greater than or equal to about 0.27, greater than or equal to about 0.28, greater than or equal to about 0.29, greater than or equal to about 0.30, greater than or equal to about 0.31, or greater than or equal to about 0.32. In the first region, the Cx may be less than or equal to about 0.34, less than or equal to about 0.33, less than or equal to about 0.32, or less than or equal to about 0.31. In the first region, the Cy may be greater than or equal to about 0.28, greater than or equal to about 0.29, greater than or equal to about 0.30, greater than or equal to about 0.31, or greater than or equal to about 0.32. The Cy may be less than or equal to about 0.34, less than or equal to about 0.33, less than or equal to about 0.32, less than or equal to about 0.31, or less than or equal to about 0.30.

The first region may have a color temperature of greater than or equal to about 6400 K, greater than or equal to about 6450 K, greater than or equal to about 6500 K, greater than or equal to about 6550 K, greater than or equal to about 6600 K, greater than or equal to about 6650 K, greater than or equal to about 6700 K, greater than or equal to about 6750 K, or greater than or equal to about 6800 K. The first region may have a color temperature of less than or equal to about 12000 K, less than or equal to about 11,000 K, less than or equal to about 10,000 K, less than or equal to about 9500 K, less than or equal to about 9000 K, less than or equal to about 8500 K, less than or equal to about 8000 K, less than or equal to about 7500 K, or less than or equal to about 7000 K.

In an embodiment, in the emission spectrum of the predetermined light belonging to the first region, second area percentage defined by the following Formula (2) may be less than or equal to about 19%.

$$[A/C] \times 100\% \quad \text{Formula (2):}$$

In Formula (2), A denotes an area of a region having a wavelength of less than or equal to about 470 nm in the emission spectrum, and C denotes a total area of the emission spectrum.

The second area percentage may be less than or equal to about 18%, less than or equal to about 17%, less than or equal to about 16%, less than or equal to about 15%, or less than or equal to about 14%. The second area percentage may be greater than or equal to about 0.1%, greater than or equal to about 0.5%, greater than or equal to about 1%, greater than or equal to about 2%, greater than or equal to about 3%, or greater than or equal to about 4%.

The color of the predetermined light of the color conversion layer may include a second region (e.g., bluish green) of Cx of about 0.18 (or about 0.19) to about 0.20 and Cy of about 0.38 to about 0.41 in CIE 1931 color coordinates. In the emission spectrum of the predetermined light having a color in the second region, the first area percentage may be less than or equal to about 65%, or less than or equal to about 60%, less than or equal to about 55%, or less than or equal to about 45%, and greater than or equal to about 1% or greater than or equal to about 5%. In the emission spectrum of the predetermined light having a color in the second region, the second area percentage is less than or equal to about 18%, less than or equal to about 15%, less than or equal to about 13%, or less than or equal to about 10% and greater than or equal to about 1%, greater than or equal to about 3%, greater than or equal to about 5%, or greater than or equal to about 7%.

The color of the predetermined light of the color conversion layer may include a third region (e.g., magenta) of Cx of about 0.39 to about 0.41 and Cy of about 0.19 to about 0.21 in CIE 1931 color coordinates. In the emission spectrum of the predetermined light having a color in the third region, the first area percentage may be less than or equal to about 80%, less than or equal to about 78% less than or equal to about 75%, less than or equal to about 70% or less than or equal to about 69.5%, and greater than or equal to about 10% or greater than or equal to about 15%. In the emission spectrum of the predetermined light having a color in the third region, the second area percentage may be less than or equal to about 18%, less than or equal to about 15%, less than or equal to about 13%, or less than or equal to about 10% and greater than or equal to about 1%, greater than or equal to about 3%, greater than or equal to about 5%, or greater than or equal to about 7%.

A display using a light source including a plurality of light emitting units such as OLED, micro LED, or QNED may provide improvements in brightness, efficiency, viewing angle, and life-span, and is attracting attention as a next-generation display. Currently, many displays implement colors by combining the light of the three primary colors of red, green, and blue. For example, one pixel of a display may include a plurality (three or more) of micro LEDs emitting blue light, each LED may provide blue light to each of the subpixels (color region) included in the pixel and optically separated, and a desired color may be realized by, for example, adjusting brightness of individual lights having a predetermined wavelength emitted from the subpixels. As the time spent using displays such as TVs, monitors, smartphones, and tablets increases, users' interest in the visual safety of displays is also increasing. The incident light emitted from the light emitting panel may be blue light, and its wavelength may be generally in a range of about 450 nm to about 470 nm. An LED device (e.g., an inorganic LED device) may emit blue light in such a range with increased luminous efficiency. Also, such a wavelength may be a wavelength suitable for the display device to express deep blue. However, light having a wavelength in this range (e.g., blue light) is known to be visually unsafe because the light having a wavelength in this range causes sleep disturbance, arousal effect, and glare due to a decrease in melatonin. Attempts to adjust (e.g., reduce) a color temperature of light emitted by the display panel or to replace blue light with another wavelength may increase visual stability of the display device. However, as the inventors have confirmed, such an attempt may change a color perceived by the human eye or does not provide a visual safety by still including a high proportion of blue wavelengths to a desired degree (e.g., as required by a commercial certification organization). Accordingly, it is desirable to develop a technology capable of reducing a ratio of light in a visually harmful range while implementing substantially the same color as the target object in the display device (for example, implementing improved color gamut without substantially changing the visually perceived color). For example, according to commercial organizations that perform certification for vision health, a fraction of harmful blue light in a total blue light emission may be desired to be less than a predetermined value (e.g., 50% or less).

The display panel according to an embodiment may implement a desired image with improved visual stability without unwanted color change of the display by including the color conversion panel and the light emitting panel as described herein. The display panel of an embodiment may reduce a blue light ratio to a desired level (e.g., 50% or less) when implementing color coordinates or other colors in the aforementioned range and provide a visually safe screen image to the user. In the color conversion panel of an embodiment, the emission wavelength of the third color region or the emission peak wavelength of the third light may be greater than or equal to about 475 nm, greater than or equal to about 476 nm, greater than or equal to about 477 nm, greater than or equal to about 478 nm, greater than or equal to about 479 nm, or greater than or equal to about 480 nm. The emission peak wavelength of the third light may be less than about 490 nm, less than or equal to about 489 nm, less than or equal to about 488 nm, less than or equal to about 487 nm, less than or equal to about 486 nm, or less than or equal to about 485 nm. The emission peak wavelength of the fourth color region or the fourth light may be greater than or equal to about 450 nm, greater than or equal to about 455 nm, or greater than or equal to about 460 nm. The emission peak wavelength of the fourth light may be less than or equal to about 469 nm, less than or equal to about 468 nm, less than or equal to about 467 nm, less than or equal to about 466 nm, less than or equal to about 465 nm, less than or equal to about 463 nm, less than or equal to about 462 nm, less than or equal to about 461 nm, or less than or equal to about 460 nm.

A difference between the emission peak wavelengths of the third light and the fourth light may be less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm. The difference between the emission peak wavelengths of the third light and the fourth light may be greater than or equal to about 5 nm, greater than or equal to about 10 nm, greater than or equal to about 15 nm, or greater than or equal to about 20 nm. In an embodiment, the peak emission wavelength of the third light may be greater than or equal to about 475 nm and less than or equal to about 485 nm, the emission peak wavelength of the fourth light may be greater than or equal to about 455 nm and less than or equal to about 465 nm, and the difference between the emission peak wavelengths of the third light and the fourth light may be less than or equal to about 30 nm, less than or equal to about 25 nm, or less than or equal to about 22 nm.

Surprisingly, the inventors have found that the inclusion of the color regions (e.g., third color region and fourth color region) having the emission peak wavelengths in the ranges and the intensities as described herein may significantly reduce the harmful blue light fraction (for example, below the level required by a certification organization) and at the same time may provide improved image quality substantially without causing color change. A difference between the emission peak wavelengths of the fourth light and the incident light may be less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2 nm. The fourth light may have substantially the same emission peak wavelength as the incident light.

The first light may have a full width at half maximum of greater than or equal to about 5 nm, greater than or equal to about 10 nm, greater than or equal to about 15 nm, greater than or equal to about 20 nm, greater than or equal to about 25 nm, greater than or equal to about 26 nm, greater than or equal to about 28 nm, greater than or equal to about 30 nm, greater than or equal to about 33 nm, greater than or equal to about 35 nm, or greater than or equal to about 38 nm. The first light may have a full width at half maximum of less than or equal to about 45 nm, less than or equal to about 40 nm, less than or equal to about 38 nm, less than or equal to about 36 nm, less than or equal to about 34 nm, less than or equal to about 32 nm, less than or equal to about 30 nm, less than or equal to about 28 nm, or less than or equal to about 25 nm.

The second light may have a full width at half maximum of greater than or equal to about 5 nm, greater than or equal to about 10 nm, greater than or equal to about 15 nm, greater than or equal to about 20 nm, greater than or equal to about 25 nm, greater than or equal to about 26 nm, greater than or equal to about 28 nm, greater than or equal to about 30 nm, greater than or equal to about 33 nm, greater than or equal to about 35 nm, or greater than or equal to about 38 nm. The second light may have a full width at half maximum of less than or equal to about 45 nm, less than or equal to about 40 nm, less than or equal to about 38 nm, less than or equal to about 36 nm, less than or equal to about 34 nm, less than or equal to about 32 nm, less than or equal to about 30 nm, less than or equal to about 28 nm, or less than or equal to about 25 nm.

The third light may have a full width at half maximum of greater than or equal to about 5 nm, greater than or equal to about 10 nm, greater than or equal to about 15 nm, greater than or equal to about 20 nm, greater than or equal to about 25 nm, greater than or equal to about 26 nm, greater than or equal to about 28 nm, greater than or equal to about 30 nm, greater than or equal to about 33 nm, greater than or equal to about 35 nm, or greater than or equal to about 38 nm. The third light may have a full width at half maximum of less than or equal to about 45 nm, less than or equal to about 40 nm, less than or equal to about 38 nm, less than or equal to about 36 nm, less than or equal to about 34 nm, less than or equal to about 32 nm, less than or equal to about 30 nm, less than or equal to about 28 nm, or less than or equal to about 25 nm.

The fourth light may have a full width at half maximum of greater than or equal to about 5 nm, greater than or equal to about 10 nm, greater than or equal to about 15 nm, greater than or equal to about 20 nm, greater than or equal to about 25 nm, greater than or equal to about 26 nm, greater than or equal to about 28 nm, greater than or equal to about 30 nm, greater than or equal to about 33 nm, greater than or equal to about 35 nm, or greater than or equal to about 38 nm. The fourth light may have a full width at half maximum of, less than or equal to about 45 nm, less than or equal to about 40 nm, less than or equal to about 38 nm, less than or equal to about 36 nm, less than or equal to about 34 nm, less than or equal to about 32 nm, less than or equal to about 30 nm, less than or equal to about 28 nm, or less than or equal to about 25 nm.

At the intersection of the normalized emission spectrum of the third light and the normalized emission spectrum of the second light, a luminance intensity may be less than or equal to about 0.5, less than or equal to about 0.45, less than or equal to about 0.4, less than or equal to about 0.35, less than or equal to about 0.3, or less than or equal to about 0.25. At the intersection of the normalized emission spectrum of the third light and the normalized emission spectrum of the second light, the luminance intensity may be greater than or equal to about 0.1, greater than or equal to about 0.15, greater than or equal to about 0.2, greater than or equal to about 0.25, greater than or equal to about 0.3, greater than or equal to about 0.35, greater than or equal to about 0.4, or greater than or equal to about 0.45.

An emission spectrum of the color conversion layer may or may not exhibit an emission peak (hereinafter, referred to as fifth emission peak) in a wavelength range of greater than about 580 nm, greater than or equal to about 585 nm, or greater than or equal to about 587 nm and less than about 600 nm, for example, less than or equal to about 595 nm, less than or equal to about 590 nm, or less than or equal to about 585 nm.

The fifth emission peak may have a full width at half maximum of greater than or equal to about 5 nm, greater than or equal to about 10 nm, greater than or equal to about 15 nm, or greater than or equal to about 20 nm. The fifth emission peak may have a full width at half maximum of less than or equal to about 50 nm, less than or equal to about 45 nm, less than or equal to about 40 nm, less than or equal to about 35 nm, less than or equal to about 30 nm, or less than or equal to about 25 nm.

The first semiconductor nanoparticles, the second semiconductor nanoparticles, and the third semiconductor nanoparticles (hereinafter referred to as semiconductor nanoparticles) included in the color conversion layer may not contain harmful heavy metals (e.g., cadmium, lead, mercury, etc.). The first semiconductor nanoparticles, the second semiconductor nanoparticles, the third semiconductor nanoparticles, the fourth semiconductor nanoparticles, or a combination thereof may have a core-shell structure including a (semiconductor nanocrystal) core and a (semiconductor nanocrystal) shell disposed on the core. The first/second/third/fourth semiconductor nanoparticles, the semiconductor nanocrystal core, and/or the semiconductor nanocrystal shell may include a Group II-VI compound, a Group III-V compound, a Group IV-VI compound, a Group IV element or compound, a Group compound, a Group I-II-IV-VI compound, or a combination thereof. The first/second/third/fourth semiconductor nanoparticles may not contain cadmium, lead, mercury, or a combination thereof.

The Group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof.

Examples of the Group compound may include $CuInSe_2$, $CuInS_2$, CuInGaSe, and CuInGaS, but is not limited thereto. Examples of the Group I-II-IV-VI compound include CuZnSnSe, and CuZnSnS, but is not limited thereto.

The Group IV element or compound may be a single element compound selected from Si, Ge, and a mixture thereof; and a binary element compound selected from SiC, SiGe, and a mixture thereof. The Group III-V compound may further include a Group II metal (e.g., InZnP, etc.)

The binary element compound, the ternary element compound or the quaternary element compound respectively exist in a uniform concentration in the particle or partially different concentrations in the same particle. In an embodiment, where the semiconductor nanoparticles have a core-shell structure, the semiconductor nanocrystals of the shell may have a larger energy bandgap than the semiconductor nanocrystals of the core.

In an embodiment, where the semiconductor nanoparticle has a core-shell structure, the semiconductor nanocrystal of the shell may have a smaller energy bandgap than the semiconductor nanocrystal of the core. In an embodiment where the semiconductor nanoparticle having the core-shell structure includes a multi-layered shell, an outer shell may have a larger energy bandgap than a shell close to the core, but is not limited thereto. In the core-shell structure including the multi-layered shell, an outer shell of the nanoparticle may have a smaller energy bandgap than the shell close to the core. In an embodiment, the semiconductor nanoparticles may include an indium phosphide-based compound (e.g., InP, InZnP, InGaP, or a combination thereof) as a light emitting center (e.g., a core). In an embodiment, the semiconductor nanoparticles may include a zinc selenide telluride-based compound (e.g., ZnTeSe) as a light emitting center (e.g., a core). The semiconductor nanoparticles may include a zinc chalcogenide-based shell (e.g., containing zinc, selenium, sulfur, or a combination thereof) disposed on the core. The shell may be a multi-layered shell. The shell may include a first layer including zinc selenide and a second layer disposed on the first layer and including zinc sulfide.

The first semiconductor nanoparticles, the second semiconductor nanoparticles, the third semiconductor nanoparticles, if present, the fourth semiconductor nanoparticles, or a combination thereof may have an (average) size of about 1 nm to about 100 nm. In an embodiment, the (average) size of the semiconductor nanoparticle(s) may be greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm. In an embodiment, the (average) particle size of the semiconductor nanoparticle(s) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10 nm, less than or equal to about 9 nm, less than or equal to about 8 nm, less than or equal to about 7 nm, less than or equal to about 6.5 nm, less than or equal to about 6 nm, less than or equal to about 5.5 nm, or less than or equal to about 5 nm. Herein, the (average) size of the nanoparticle(s) may see a diameter (or, if not spherical, a diameter calculated assuming a spherical shape from an electron microscope two-dimensional image of the nanoparticles). Herein, the size may be a size of a single particle or an average size of a nanoparticle population. The size of the nanoparticles can be obtained, for example, using an image analysis program (e.g., Image J) for transmission electron microscopy images.

The nanoparticles may have any shape. In an embodiment, the nanoparticles may include spherical, pyramidal, multi-arm, or cubic nanoparticles, nanotubes, nanowires, nanofibers, nanosheets, or a combination thereof. The semiconductor nanoparticles are commercially available or may be synthesized by any method.

The semiconductor nanoparticles may further include an organic material such as an organic ligand and an organic solvent on their surfaces. In an embodiment, the organic ligand may be $RCOOH$, $RNH_2$, $R_2NH$, $R_3N$, $RSH$, $R_3PO$, $R_3P$, $ROH$, $RCOOR'$, $RPO(OH)_2$, $R_2POOH$ (where R and R' are each independently substituted or unsubstituted C1 to C40 (or C3 to C24) aliphatic hydrocarbon group, for example, a substituted or unsubstituted alkyl, a substituted or unsubstituted alkenyl, or a C3 to C40 (or C6 to C20) aromatic hydrocarbon group, for example, an aryl group), or a combination thereof.

The semiconductor nanoparticles (or semiconductor nanoparticles-polymer composite as will be described later) may have a quantum efficiency (quantum yield) of greater than or equal to about 40%, greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, greater than or equal to about 95%, or greater than or equal to about 100%. The quantum efficiency may be measured using a suitable equipment (QE-2100 (manufacturer: Otsuka Electronics)) for the quantum dot dispersion or quantum dot-polymer composite, but the disclosure is not limited thereto. The semiconductor nanoparticles of an embodiment (or the semiconductor nanoparticle polymer composite of an embodiment) may have a full width at half maximum of less than or equal to about 50 nm, less than or equal to about 45 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, for example, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm. The full width at half maximum may be greater than or equal to about 10 nm, greater than or equal to about 15 nm, or greater than or equal to about 20 nm.

Herein, a quantum efficiency may be a relative or absolute quantum yield, which may be easily measured by commercially available equipment (e.g., from Hitachi or Hamamatsu, etc.). The quantum efficiency (or quantum yield) may be measured either in solution or in the solid state (in a composite). In an embodiment, quantum efficiency (or quantum yield) is the ratio of photons emitted to photons absorbed by the nanostructure or population thereof. In an embodiment, quantum efficiency may be measured by any method. For example, two methods such as an absolute method and a relative method may be used to measure fluorescence quantum yield or efficiency. In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but the present disclosure is not limited thereto. The QY or quantum efficiency may be determined easily and reproducibly by using commercially available equipment from Hitachi Co., Ltd. or Hamamatsu Co. Ltd., Otsuka QE2100, etc., and by referring to manuals provided by equipment manufacturers.

The full width at half maximum and the maximum PL peak wavelength may be measured, for example, by a photoluminescence spectrum obtained by a spectrophotometer such as a fluorescence spectrophotometer or the like.

According to an embodiment, an amount of the first semiconductor nanoparticles (or the second semiconductor nanoparticles or the third semiconductor nanoparticles or fourth semiconductor nanoparticles) in the first color region (or in the second color region, or in the third or fourth color region) or a composite included therein may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, greater than or equal to about 40 wt %, or greater than or equal to about 45 wt % based on the total weight of the composite. The amount may be less than or equal to about 70 wt %, for example, less than or equal to about 65 wt %, less than or equal to about 60 wt %, less than or equal to about 55 wt %, or less than or equal to about 50 wt % based on the total weight of the composite included in a color region.

The total weight of the composite may substantially correspond to the solids weight in the ink compositions described herein. In an embodiment, the polymer matrix may include a linear (co)polymer, a crosslinked (co)polymer, or a combination thereof. The linear (co)polymer may include (substituted or unsubstituted) ethylene or propylene repeating units. The crosslinked (co)polymer may include a thiolene resin, a crosslinked poly(meth)acrylate, a crosslinked polyurethane, a crosslinked epoxy resin, a crosslinked vinyl polymer, a crosslinked silicone resin, or a combination thereof. The polymer may be an acrylic resin, a urethane resin, a silicone resin, an epoxy resin, a cardo-based resin, an imide resin, a derivative thereof, or a combination thereof, but is not limited thereto. The (polymer) matrix may include a crosslinked polymer and/or a linear polymer. The crosslinked polymer may include a thiolene resin, a crosslinked poly(meth)acrylate, a crosslinked polyurethane, a crosslinked epoxy resin, a crosslinked vinyl polymer, a crosslinked silicone resin, or a combination thereof. The linear polymer may include a carboxylic acid-containing repeating unit. The polymer matrix may further include an alkali-soluble binder polymer added to ensure patternability in the ink composition to be described later. The linear polymer having the carboxylic acid group may be used as a dispersant. The crosslinked polymer may include at least one selected from a polymerization product (e.g., insulating polymer) of a polymerizable monomer having a carbon-carbon double bond (at least one, for example, at least two, at least three, at least four, or at least five), and a polymerization product of the polymerizable monomer and optionally a multiple thiol compound having at least two thiol groups at the terminal end. The polymer matrix may include a light transmitting polymer (e.g., insulating polymer). In an embodiment, the color region or the semiconductor nanoparticle-polymer composite included therein may optionally further include metal oxide particle(s). In such an embodiment, the metal oxide particle(s) may be dispersed within the matrix.

The fourth color/light transmitting region may further include a fourth matrix and optionally, metal oxide particles. The fourth color conversion/light transmitting region may further include or not include color convertible semiconductor nanoparticles (e.g., fourth semiconductor nanoparticles such as blue light emitting quantum dots and the like). The metal oxide particulates may include $TiO_2$, $SiO_2$, $BaTiO_3$, $Ba_2TiO_4$, ZnO, or a combination thereof. The metal oxide particulates may be non-luminescent. Herein, a term of the metal oxide may include oxides of metals or semi-metals.

A diameter of the metal oxide particulates is not particularly limited but appropriately selected. The diameter of the metal oxide particulates may be greater than or equal to about 100 nm, for example greater than or equal to about 150 nm, or greater than or equal to about 200 nm and less than or equal to about 1000 nm or less than or equal to about 800 nm.

In an embodiment where the fourth color/light transmitting region further includes the metal oxide particles, an amount of the metal oxide particulates may be, based on a total weight of the composite, greater than or equal to about 1 wt %, greater than or equal to about 5 wt %, or greater than or equal to about 10 wt % and less than or equal to about 50 wt %, less than or equal to about 30 wt %, or less than or equal to about 15 wt %. In the composite, based on the total weight of the composite, an amount of the polymer matrix may be in a range of about 1 wt % to about 99 wt %, about 10 wt % to about 90 wt %, about 20 wt % to about 80 wt %, about 30 wt % to about 70 wt %, about 40 wt % to about 60 wt %, about 45 wt % to about 55 wt %, or a combination thereof. The metal oxide particulates may scatter and/or reflect light emitted from the semiconductor nanoparticles and/or the light emitting unit 180 of the light emitting panel 100 to an upper substrate (or when present, color filter layers 230a, 230b, and 230c) (see FIG. 4C). In the first color region, the second color region, the third color region, or the fourth color region, when present, an amount of the metal oxide may be, based on the total weight of the composite disposed in the color conversion region, greater than or equal to about 0.1 wt %, greater than or equal to about 0.5 wt %, greater than or equal to about 1 wt %, greater than or equal to about 1.5 wt %, greater than or equal to about 2 wt %, greater than or equal to about 2.5 wt %, greater than or equal to about 3 wt %, greater than or equal to about 3.5 wt %, greater than or equal to about 4 wt %, greater than or equal to about 4.5 wt %, greater than or equal to about 5 wt %, or greater than or equal to about 10 wt %. The amount of the metal oxide may be less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %.

Referring to FIG. 4C, the color filter layers 230a, 230b, 230c, and 230d may be further disposed between the upper substrate 210 and the color conversion layer. The color filter layers are disposed in a direction that light passing through the color conversion layer 270 is emitted. The color filter layers respectively may include a color filter disposed overlapping each subpixel or color region $PX_1$, $PX_2$, $PX_3$, and $PX_4$, which selectively transmits light of different wavelength spectra. The color filter may selectively transmit light of a same wavelength spectrum as a color displayed in each subpixel or color region $PX_1$, $PX_2$, $PX_3$, and $PX_4$ and selectively transmit light of an emission spectrum converted in each region of the color conversion layer 270. In an embodiment, each of the first subpixel $PX_1$, the second subpixel $PX_2$, the third subpixel $PX_3$, and the fourth subpixel $PX_4$ displays red, green, cyan, and blue, respectively, and lights of red emission spectrum, green emission spectrum, cyan emission spectrum, and blue emission spectrum are emitted from the first color conversion region 270a, the second color conversion region 270b, the third color conversion region 270c, and the light transmission region 270d, respectively. In such an embodiment, the first color filter 230a overlapping the first color conversion region 270a may be a red filter, the second color filter 230b overlapping the second color conversion region 270b may be a green filter, the third color filter 230c overlapping the third color conversion region 270c may be a cyan filter, and the fourth color filter 230d overlapping the light transmitting region 270d may be a blue filter. The first color filter, the second color filter, the third color filter, and the fourth color filter may respectively include a pigment or a dye for selectively transmitting light of the red wavelength spectrum, the green wavelength spectrum, the cyan wavelength spectrum, or the blue wavelength spectrum but absorb and/or reflect light of the other wavelength spectra.

A light blocking pattern may be further provided between the color filters and the upper substrate. The light blocking pattern may partition each subpixel $PX_1$, $PX_2$, $PX_3$, and $PX_4$ and be disposed between the neighboring subpixels $PX_1$, $PX_2$, $PX_3$, and $PX_4$. The light blocking pattern may be, for example, a black matrix. The light blocking pattern 220 may overlap an edge of the adjacent color filter.

The color conversion panel may further include a planarization layer 240 disposed between color filters and color conversion layer. The planarization layer 240 may reduce or eliminate a level difference caused by the color filters. The planarization layer 240 may include an organic material, an inorganic material, an organic-inorganic material, or a combination thereof, for example, oxide, nitride or oxynitride, for example, silicon oxide, silicon nitride, silicon oxynitride, or a combination thereof but is not limited thereto. The planarization layer 240 may be one or two or more layers and cover the entire area of the upper substrate.

The color conversion panel may further include an encapsulation layer 290 covering the color conversion layer 270 and the partition wall 250. The encapsulation layer 290 may include a glass plate, a thin metal film, an organic film, an inorganic film, an organic-inorganic film, or a combination thereof. The organic film may include, for example, an acrylic resin, a (meth)acrylic resin, a polyisoprene, a vinyl resin, an epoxy resin, a urethane resin, a cellulose resin, a perylene resin, or a combination thereof, but is not limited thereto. The inorganic film may include, for example, oxides, nitrides and/or oxynitrides, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may have a single layer structure or a multilayer structure including two or more layers.

In the color conversion panel or the display panel of an embodiment, an aperture ratio may be about 1% to about 100%, about 2% to about 95%, about 3% to about 90%, about 4% to about 85%, about 5% to about 80%, about 6% to about 75%, about 7% to about 70%, about 8% to about 65%, about 9% to about 60%, about 10% to about 55%, about 11% to about 50%, about 12% to about 45%, about 13% to about 40%, about 14% to about 35%, about 15% to about 30%, about 16% to about 25%, about 17% to about 20%, or a combination thereof.

In the color conversion panel or the display panel of an embodiment, the aperture ratio may be less than or equal to about 15%, less than or equal to about 14%, less than or equal to about 13%, less than or equal to about 12%, less than or equal to about 11%, less than or equal to about 10%, less than or equal to about 9%, less than or equal to about 8%, or less than or equal to about 7%.

Figure 8:
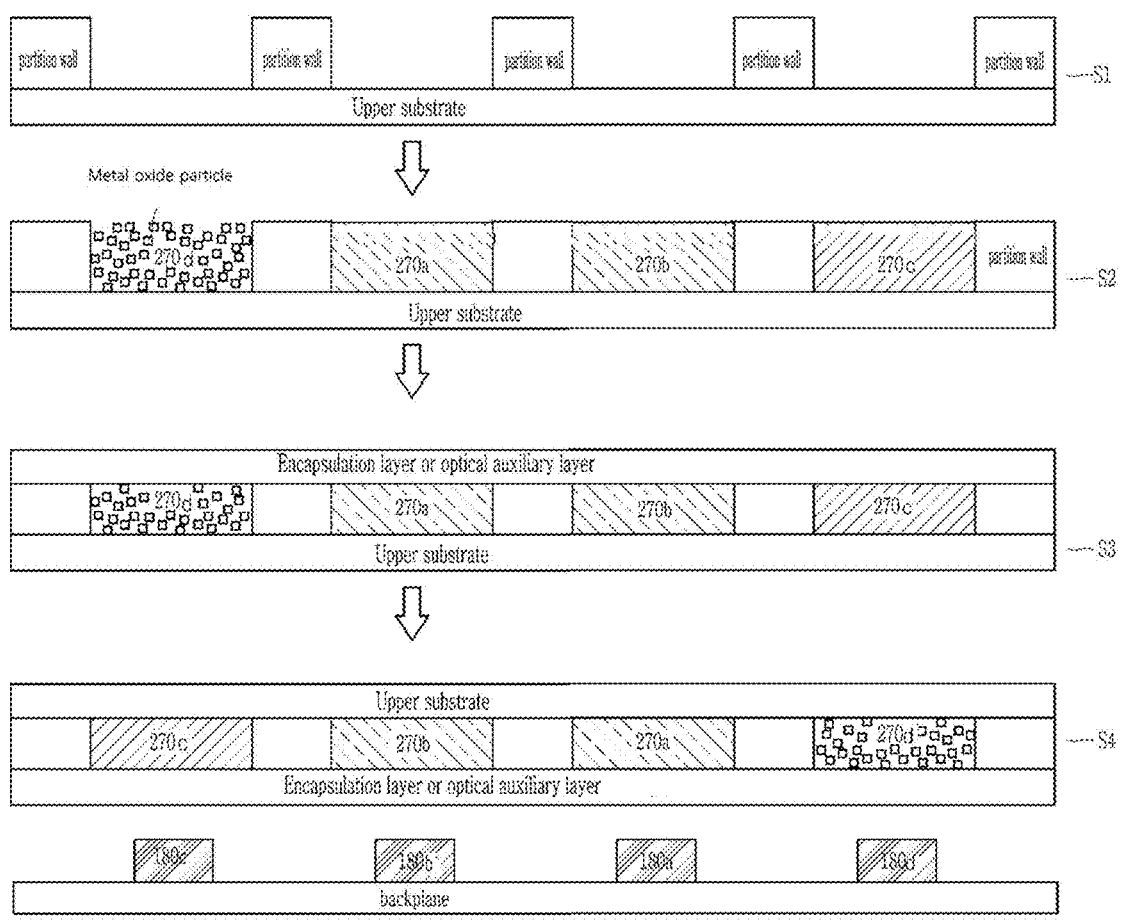
FIG. 8 is a schematic flowchart of a method of producing a display panel according to an embodiment.
Figure 9:
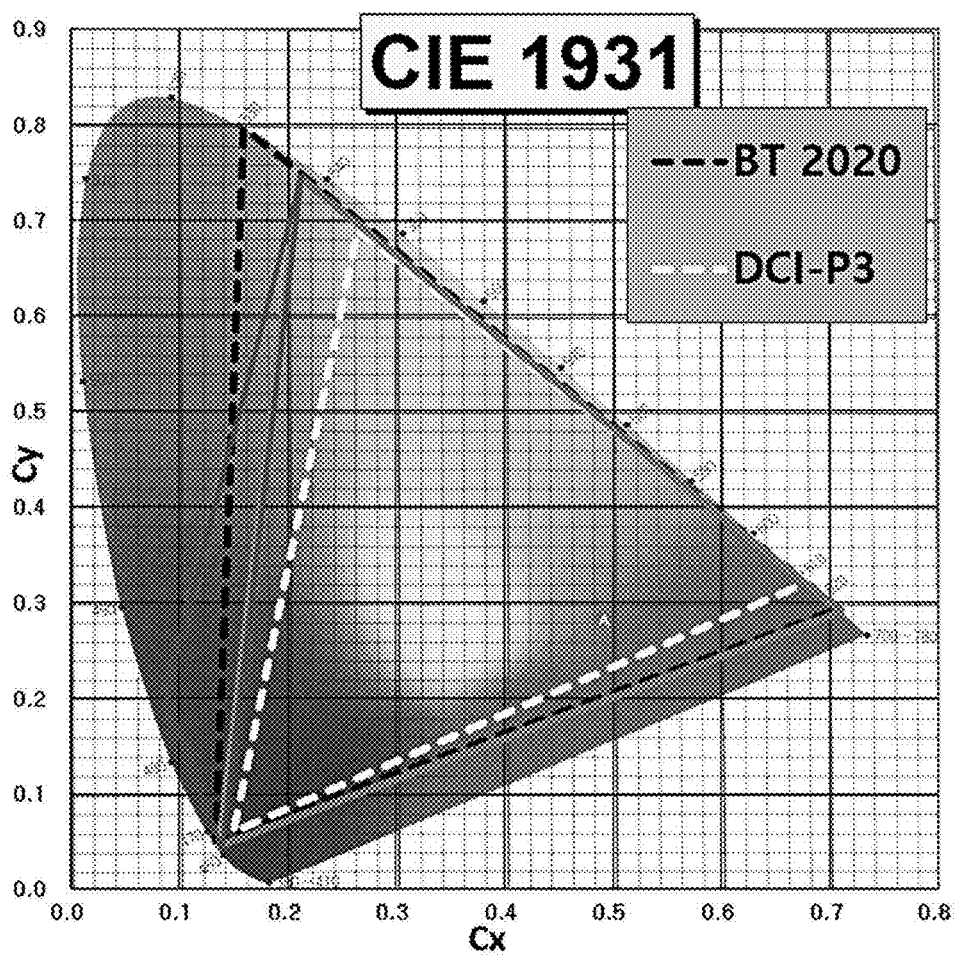
FIG. 9 is a diagram for explaining color coordinates and color gamut according to CIE 1931.

A method of manufacturing the display panel according to an embodiment may include providing the color conversion panel on the light emitting panel, where the providing the color conversion panel includes forming a semiconductor nanoparticle-polymer composite in each of a plurality of color regions on a base structure having a partition wall by using an ink composition to define the plurality of color regions (hereinafter, referred to as formation of a composite pattern) (see FIG. 8). The preparation of the light emitting panel may vary depending on a type of a light emitting unit (e.g., QNED or micro LED), which may be manufactured in a known method. The formation of a composite pattern may be performed in an appropriate method. In an embodiment, the formation of a composite pattern may be performed by an inkjet process. The inkjet process may include depositing and polymerizing the ink composition in each of the defined color regions. In an embodiment, the formation of a composite pattern may be performed by a photolithography process. The photolithography process may include applying the ink composition on a substrate (optionally, including a partition wall such as a black matrix and the like), optionally, prebaking it, exposing it under a mask pattern, developing it in a developing solution (e.g., an alkali aqueous solution), and optionally, post-baking it.

In an alternative embodiment, the preparation of the color conversion panel may entail electrohydrodynamic (EHD) patterning. In the EHD patterning, an ink composition containing nanoparticles may be patterned by applying a strong electric field between a nozzle and a lower electrode therebeneath to form microdroplets.

The inkjet process and the photolithography process, which use an ink composition containing semiconductor nanoparticles, may be appropriately selected, but the disclosure is not particularly limited thereto. The composition may include semiconductor nanoparticles, a combination of polymerizable monomers (e.g., capable of providing cross-linking), and optionally, an organic solvent, a polymer (e.g., a linear copolymer); an initiator; and the like. The composition may further include various components according to its pattern-forming method. In an embodiment, the combination of polymerizable monomers may include a polymerizable (e.g., photopolymerizable) monomer including a carbon-carbon double bond and optionally, a thiol compound (e.g., a monothiol or polythiol compound). The polymerizable monomer may include an acrylic monomer. The polymerizable monomer may include alkyl(meth)acrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth)acrylate, neopentylglycoldi(meth)acrylate, pentaerythritoldi(meth)acrylate, pentaerythritoltri(meth)acrylate, pentaerythritoltetra(meth)acrylate, dipentaerythritoldi(meth)acrylate, dipentaerythritoltri(meth)acrylate, dipentaerythritolpenta(meth)acrylate, pentaerythritolhexa(meth)acrylate, bisphenol A di(meth)acrylate, bisphenol A epoxyacrylate, trimethylolpropanetri(meth)acrylate, ethylene glycolmonomethylether(meth)acrylate, novolacepoxy(meth)acrylate, diethylene glycoldi(meth)acrylate, triethylene glycoldi(meth)acrylate, propylene glycoldi(meth)acrylate, tris(meth)acryloyloxyethyl phosphate, tricyclodecane dimethanol diacrylate (A-DCP), 1,3,5-triallyl-1,3,5-triazine-2,4,6(1H,3H,5H)trione, or a combination thereof. The thiol compound may be a dithiol compound, a trithiol compound, a tetrathiol compound, or a combination thereof. For example, the thiol compound may include glycoldi-3-mercaptopropionate, glycoldimercapto acetate, trimethylolpropanetris (3-mercaptopropionate), pentaerythritol tetrakis(3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

In an embodiment where the photolithography process is used, the composition may further include a binder. The binder may be an alkali soluble compound having —COOH. The binder may be for development of the alkali aqueous solution in the photo-lithography process. The binder may be for dispersion of semiconductor nanoparticles in the ink composition. The binder may include: a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group, or a copolymer thereof; a multiple aromatic ring-containing polymer having a backbone structure where two aromatic rings are bound to a quaternary carbon atom that is a constituent atom of another cyclic moiety in the main chain and including a carboxylic acid group (—COOH) (hereinafter, a cardo binder); or a combination thereof. The binder polymer may have any acid value and molecular weight and is not particularly limited thereto.

The initiator included in the composition is for the aforementioned polymerization of monomers. The initiator is a compound capable of catalyzing a radical reaction (e.g., radical polymerization of monomers) by generating radical chemical species (e.g., by heat or light) under mild conditions. The initiator may include a thermal initiator or a photoinitiator. The thermal initiator may include, but is not limited to, azobisisobutyronitrile, benzoyl peroxide, and the like. The photoinitiator may include a triazine-based compound, an acetophenone compound, a benzophenone compound, a thioxanthone compound, a benzoin compound, an oximeester compound, an aminoketone compound, a phosphine or phosphineoxide compound, a carbazole-based compound, a diketone compound, a sulfonium borate-based compound, a diazo-based compound, a biimidazole-based compound, or a combination thereof, but is not limited thereto. The initiator may include Igacure 754, hydroxycyclohexyl phenyl ketone (Irgacure 184, CAS 947-19-3), 2,4,6-trimethylbenzoyl diphenylphosphine oxide (Irgacure TPO, CAS 75980-60-8), phenyloxy-acetic acid 2-[2-oxo-2-phenyl-acetoxy-ethoxy]-ethyl ester, or a combination thereof.

The ink composition of an embodiment may be solvent-free or further include an organic solvent. Types of usable organic solvents are not particularly limited. The types and amount of the organic solvent may be appropriately determined in consideration of types and amounts of the aforementioned main components (i.e., quantum dots, dispersing agents, polymerizable monomers, initiators, thiol compounds, if present), and additives to be described later. The composition includes the solvent in a balance amount after excluding the desired solid (non-volatile) content. Examples of the solvent may include ethylene glycols such as ethylene glycol, diethylene glycol, and polyethylene glycol; glycolethers such as ethylene glycolmonomethylether, ethylene glycolmonoethylether, diethylene glycolmonomethylether, ethylene glycoldiethylether, and diethylene glycoldimethylether; glycoletheracetates such as ethylene glycolacetate, ethylene glycolmonoethyletheracetate, diethylene glycolmonoethyletheracetate, and diethylene glycolmonobutyletheracetate; propylene glycols such as propylene glycol; propylene glycolethers such as propylene glycolmonomethylether, propylene glycolmonoethylether, propylene glycolmonopropylether, propylenemonobutylether, propylene glycoldimethylether, dipropylene glycoldimethylether, propylene glycoldiethylether, and dipropylene glycoldiethylether; propylene glycoletheracetates such as propylene glycolmonomethyl ether acetate, and dipropylene glycolmonoethyletheracetate; amides such as N-methylpyrrolidone, dimethyl formamide, and dimethyl acetamide; ketones such as methylethylketone (MEK), methylisobutylketone (MI BK), and cyclohexanone; petroleums such as toluene, xylene, and solvent naphtha; esters such as ethyl acetate, butyl acetate, ethyl lactate, ethyl 3-ethoxy propionate; ethers such as diethyl ether, dipropyl ether, and dibutyl ether; aliphatic, alicyclic, or aromatic hydrocarbons, and a mixture thereof.

The composition may further include, if desired, various additives such as a leveling agent, a coupling agent, and the like, in addition to the aforementioned components. An amount of the additives is not particularly limited but may be appropriately adjusted unless it negatively affects the preparation of the composition, the preparation of the quantum dot-polymer composite, and the patterning of the composite, if desired.

The composition may be prepared in a method including preparing quantum dot dispersion including the quantum dots, the dispersing agent, and the organic solvent; and mixing the quantum dot dispersion with an initiator; a polymerizable monomer (e.g., an acrylic monomer); optionally, a thiol compound; optionally, metal oxide particulates, and optionally, the aforementioned additives.

Each aforementioned component may be sequentially or simultaneously mixed, but the mixing order may not be particularly limited. The composition may provide, the aforementioned composite through for example, a radical polymerization. In the composition, an amount of each component may be appropriately selected without particular limitations.

The display panel may be applied to various electronic devices such as a display device and the like, for example, TV, a monitor, a computer, a tablet PC, a mobile device, and the like or a lighting device such as a light source. Accordingly, the electronic devices of an embodiment include the display panel. The electronic devices may include a portable terminal device, a monitor, a note PC, a television, an electric sign board, a camera, an electronic component for a vehicle, or a combination thereof.

Hereinafter, embodiments will be described in greater detail with reference to examples. However, they are merely examples of the disclosure, and the disclosure is not limited thereto.

Examples 1 to 4

Figure 10:
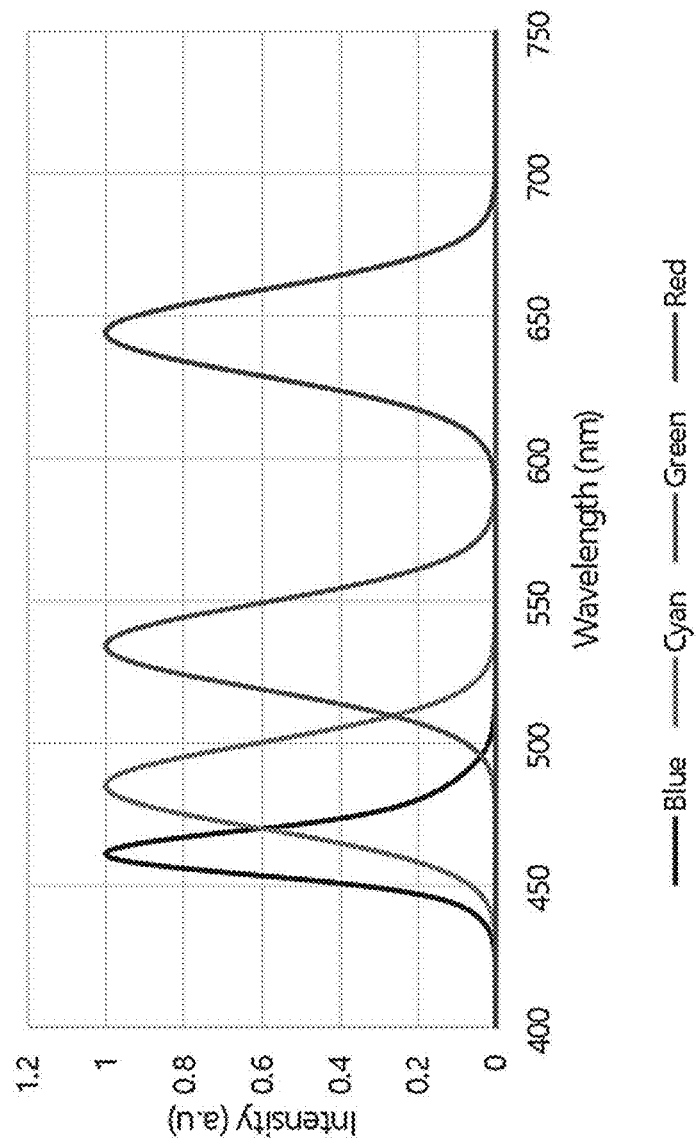
FIG. 10 shows emission spectra of red light, green light, cyan light, and blue light used in Examples 1 to 4.
Figure 11A:
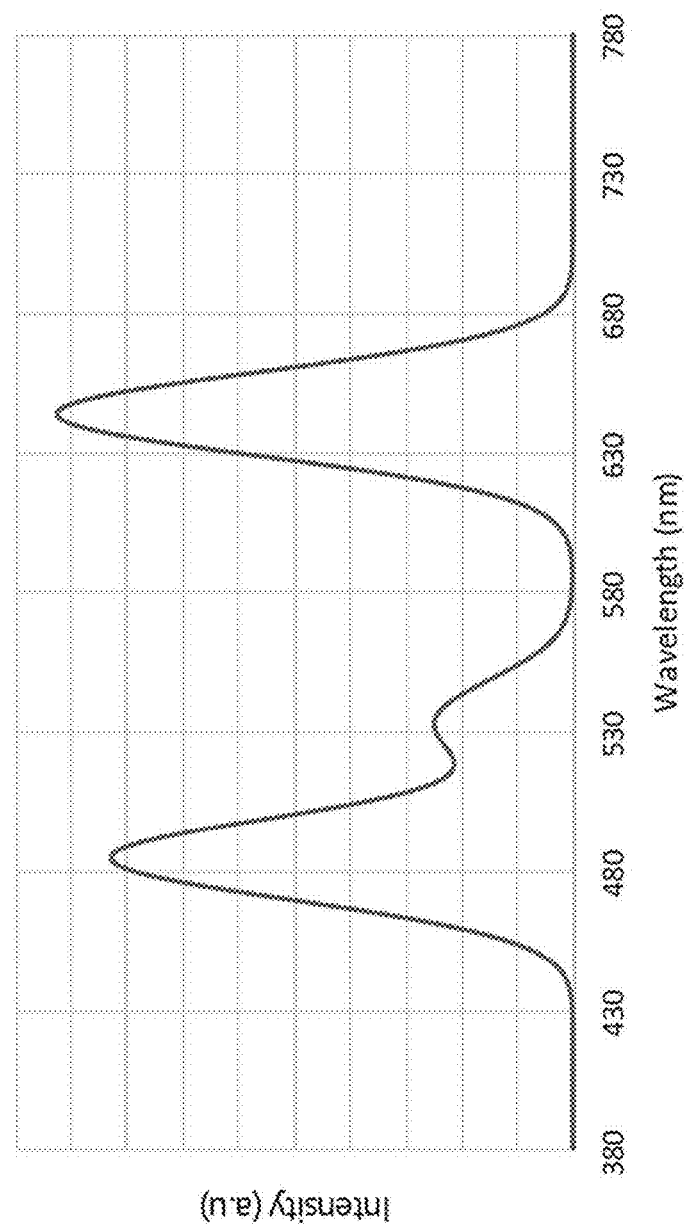
FIGS. 11A to 11D show emission spectra of the display panels of Examples 1 to 4, respectively.
Figure 11B:
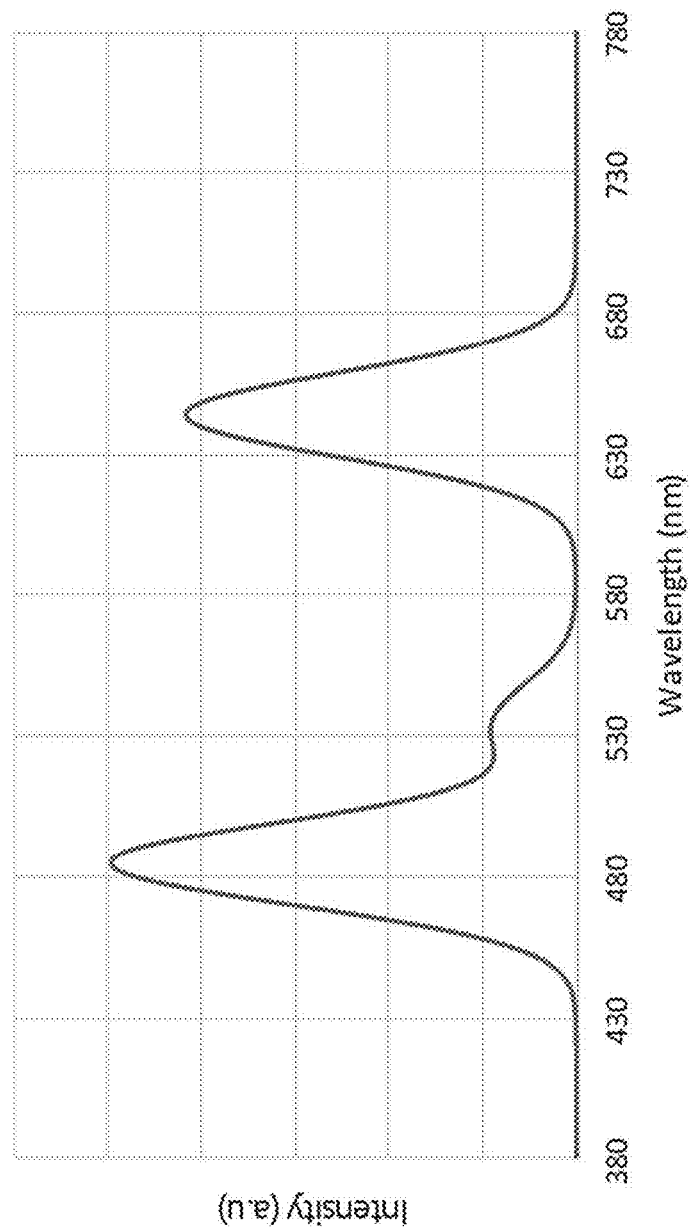
Figure 11C:
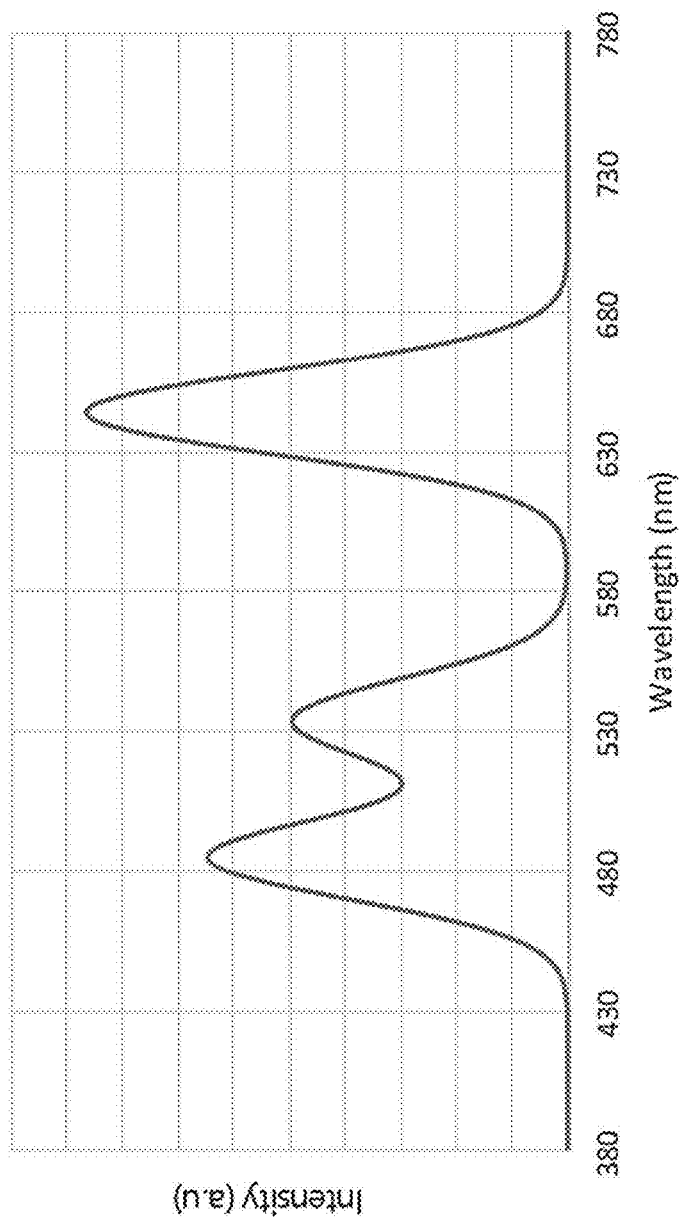
Figure 11D:
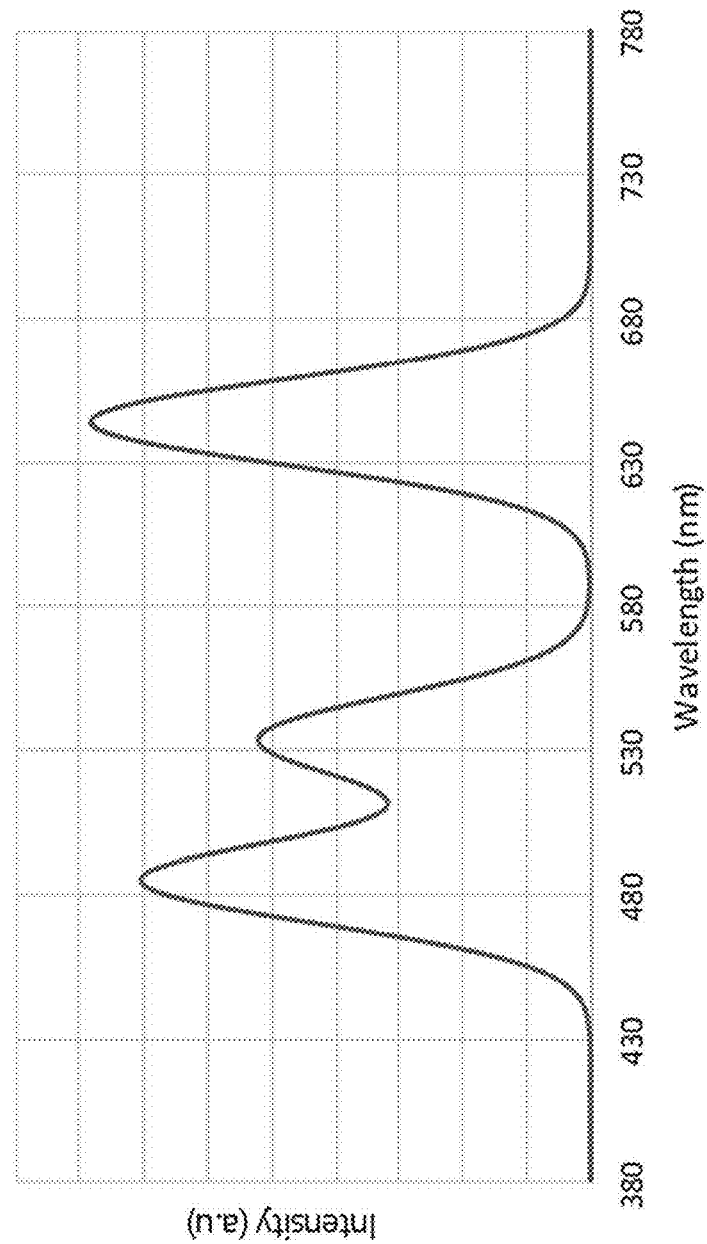
Figure 12A:
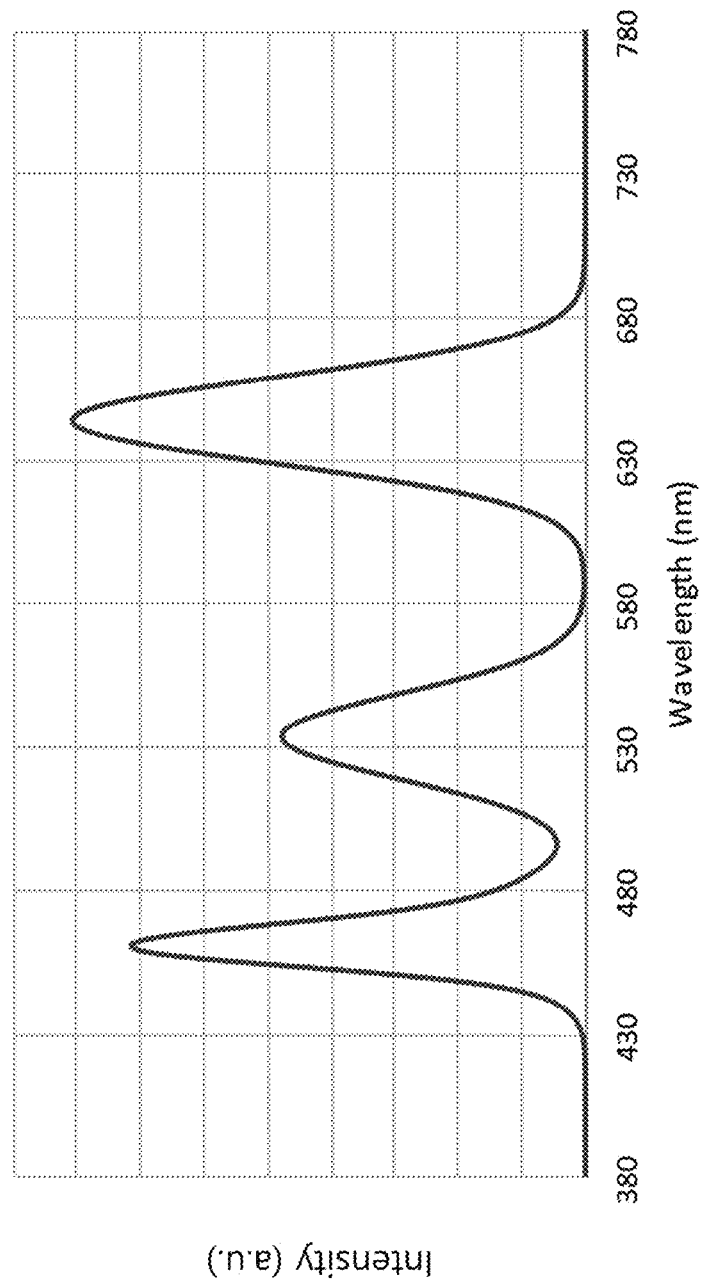
FIGS. 12A to 12D show emission spectra of display panels of Comparative Examples 1 to 4, respectively.
Figure 12B:
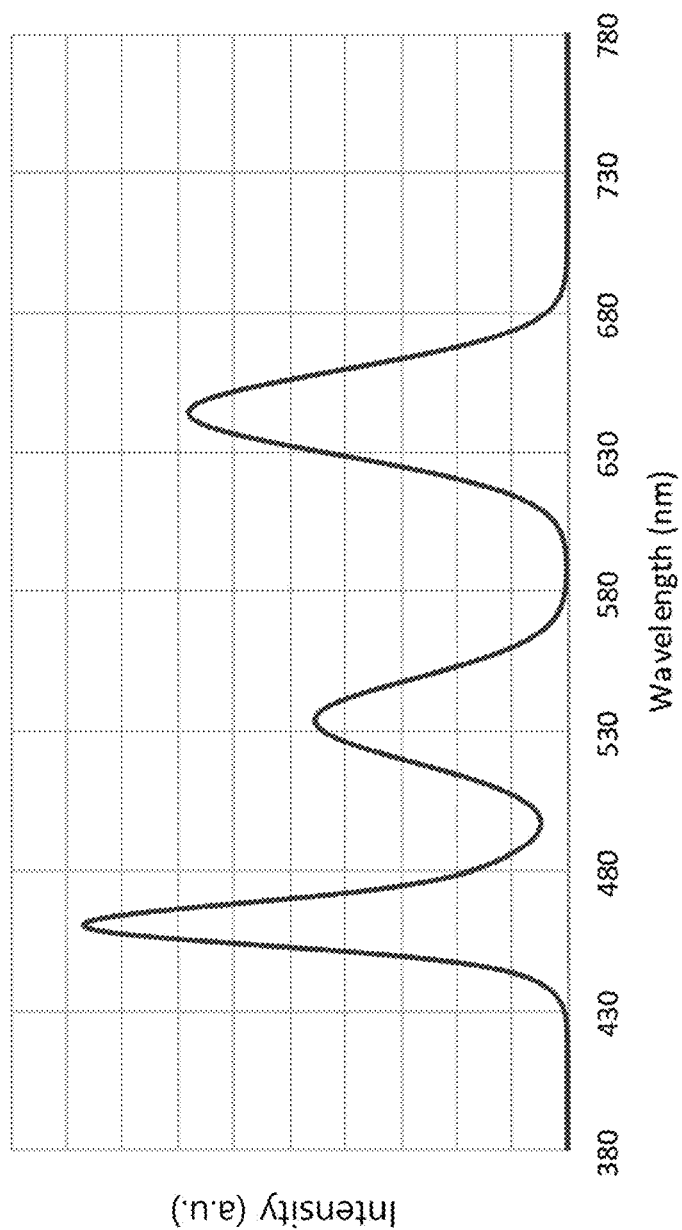
Figure 12C:
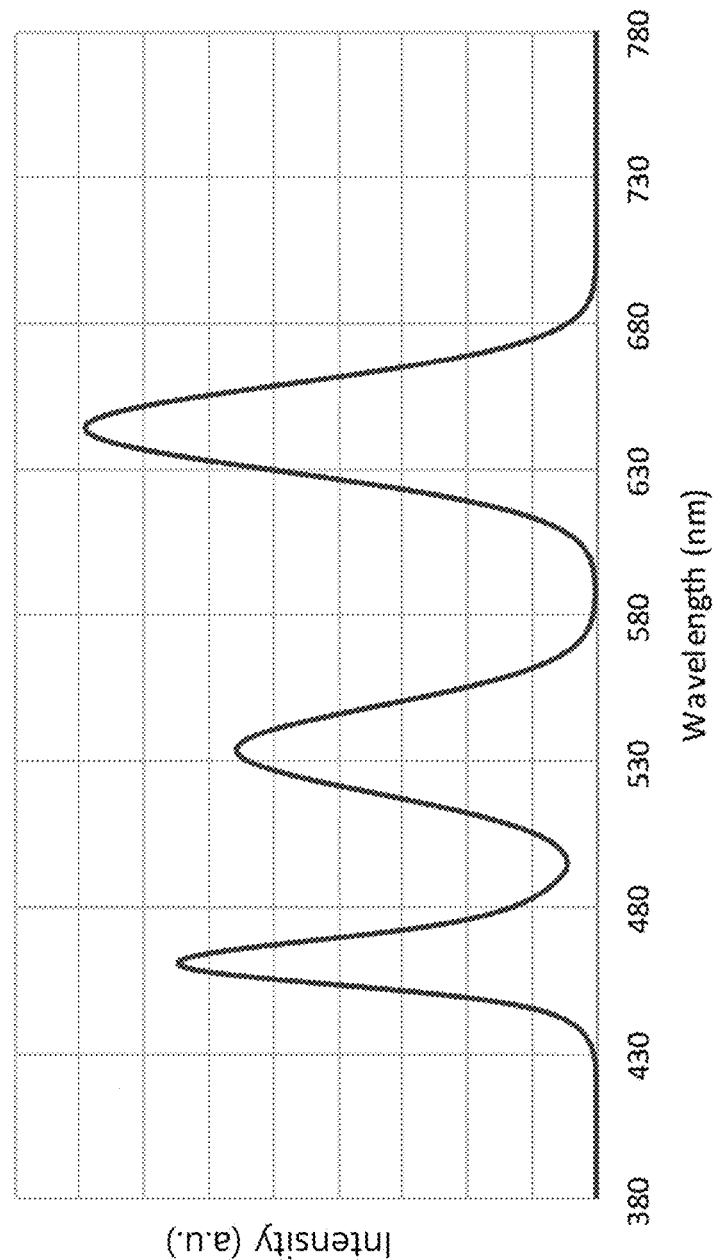
Figure 12D:
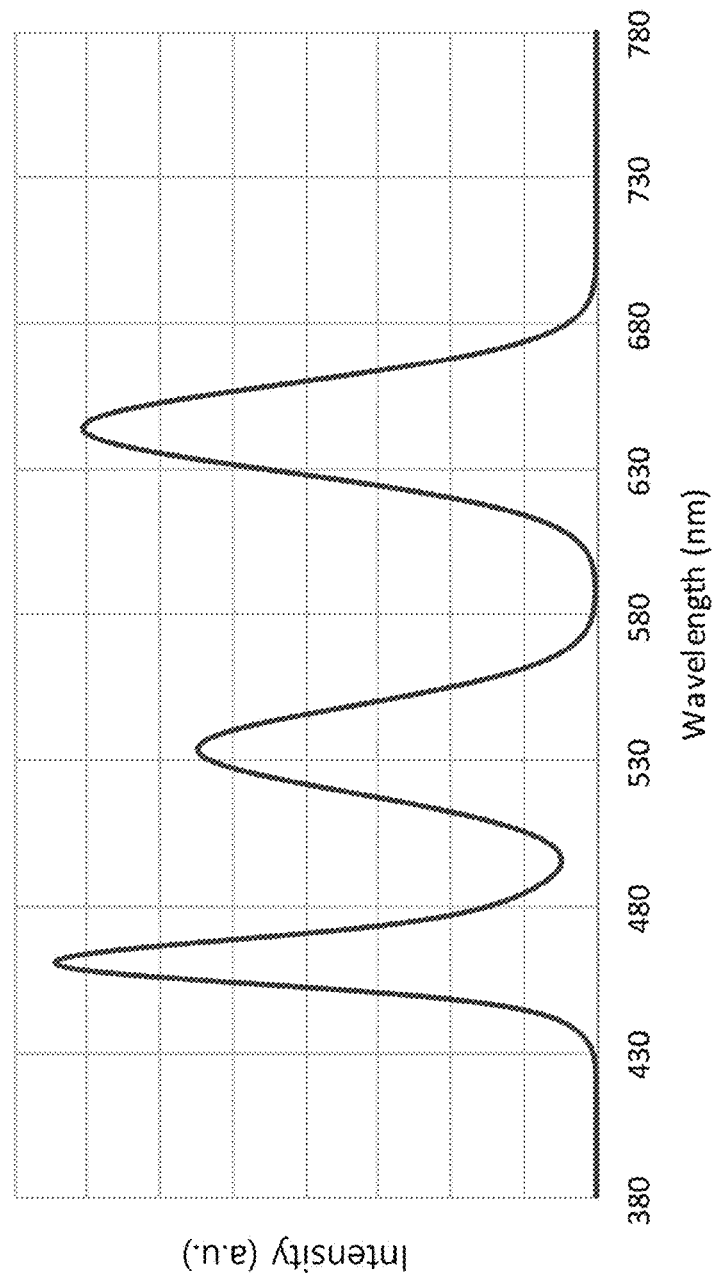

A display panel having a structure as shown in FIG. 7 was prepared by using the semiconductor nanoparticles shown in Table 1, a polymer matrix including an acrylate polymer, and a LED emitting blue light. The display panel thus prepared included a light emitting panel emitting a fourth light; and a color conversion panel including semiconductor nanoparticles so that a first color region, a second color region, and a third color region may emit light of spectra shown in Table 1 and FIG. 10, respectively, and a fourth color region may pass incident light. For the display panel, a ratio among blue, cyan, green, and red spectra was adjusted, for example, by changing the intensity or the amount of the light from the light emitting panel, so that light emitted from the color conversion layer exhibited a predetermined color temperature and a predetermined color coordinate as summarized in Table 2, where the spectra emitted from the color conversion layer are provided in FIGS. 11A to 11D, respectively.

TABLE 1

| | Emission peak wavelength | Full width at half maximum | Semiconductor nanoparticle composition |
|---|---|---|---|
| First color region | 644 nm | about 35 nm | QD (InP/ZnSeS) |
| Second color region | 535 nm | about 35 nm | QD (InP/ZnSeS or ZnTeSe/ZnSeS) |
| Third color region | 480 nm | about 35 nm | QD (InZnP/ZnSeS) |
| Fourth color region | 460 nm | about 20 nm | LED |

According to the formula below, a first area percentage and a second area percentage are calculated and shown in Table 2.

[A/B]×100%: first area percentage
[A/C]×100%: second area percentage
A: an area of a region having a wavelength of less than or equal to about 470 nm in the emission spectrum
B: an area of a region having a wavelength of less than or equal to about 480 nm in the emission spectrum
C: a total area of the emission spectrum.

TABLE 2

| | Color temperature | Color coordinate | | Second area percentage | First area percentage |
|---|---|---|---|---|---|
| | | Cx | Cy | | |
| Example 1 | White (6700 K) | 0.31 | 0.32 | 6.9% | 43.8% |
| Example 2 | White (11000 K) | 0.28 | 0.29 | 8.2% | 43.8% |
| Example 3 | White (6500 K) | 0.31 | 0.33 | 6.8% | 43.8% |
| Example 4 | White (8500 K) | 0.29 | 0.30 | 7.8% | 43.8% |

Referring to the results of Table 2 and FIGS. 11A to 11D, the display panels of Examples 1 to 4 emit light with a desired color coordinate within the Cx and Cy ranges and exhibit a first area percentage significantly lower than 65%, even 50%, and a significantly low percentage of blue light (e.g., second area percentage) of less than or equal to 470 nm in the entire spectrum.

Comparative Examples 1 to 4

A display panel was manufactured in the same manner as in Example 1 except that the third color region was not included. For the display panel, a ratio among blue, green, and red spectra was adjusted, for example, by changing the intensity (or amount) of light from the light emitting panel, so that the light emitted from the color conversion layer showed a predetermined color temperature and color coordinate as summarized in Table 3, where the spectra of light emitted from the color conversion layer are provided in FIGS. 12A to 12D, respectively.

TABLE 3

| | Color temperature | Color coordinate Cx | Color coordinate Cy | Second area percentage | First area percentage |
|---|---|---|---|---|---|
| Comparative Example 1 | White (6700 K) | 0.31 | 0.32 | 19.8% | 84.2% |
| Comparative Example 2 | White (11000 K) | 0.28 | 0.29 | 24.9% | 84.2% |
| Comparative Example 3 | White (6500 K) | 0.31 | 0.33 | 19.1% | 84.2% |
| Comparative Example 4 | White (8500 K) | 0.29 | 0.30 | 23.1% | 84.2% |

Referring to the results of Table 3 and FIGS. 12A to 12D, the display panels of Comparative Examples 1 to 4 exhibit a first area percentage much exceeding 65% or 50% at a desired color coordinate within the Cx and Cy ranges and also, a percentage (e.g., a second area percentage) of blue light of less than or equal to 470 nm in a range of greater than or equal to 19% in the entire spectrum.

Examples 5 to 6

Figure 13A:
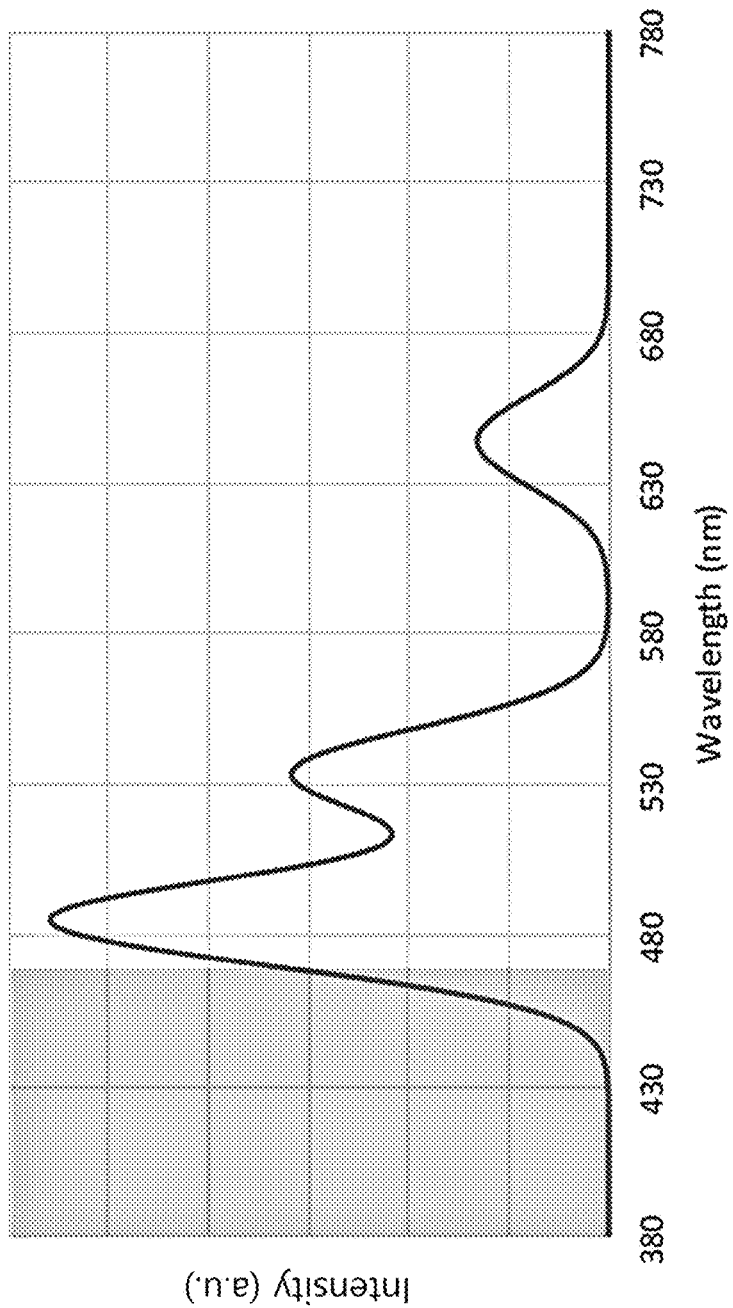
FIGS. 13A to 13B show emission spectra of the display panels of Examples 5 to 6, respectively.
Figure 13B:
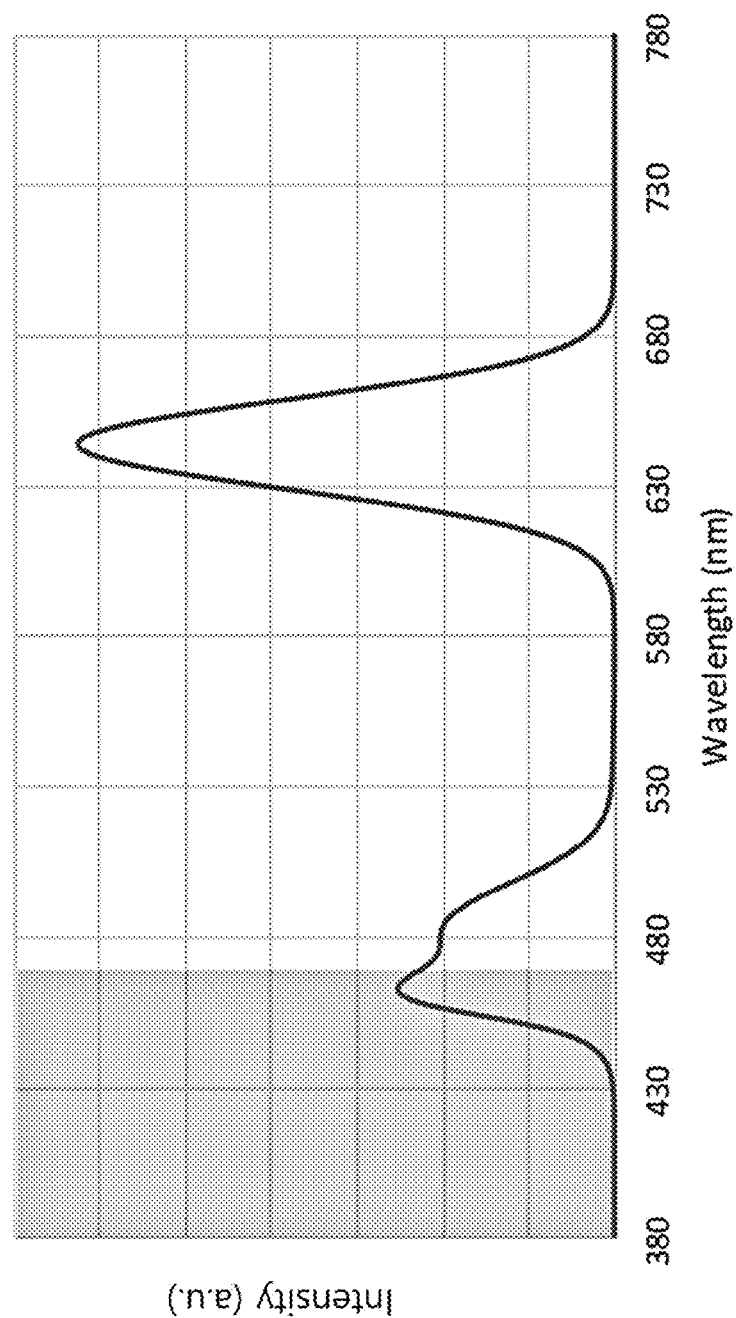

A display panel was manufactured in substantially the same manner as in Example 1, and the color conversion panel and the light emitting panel were controlled for example by changing a ratio among blue, cyan, green, and red spectra, whereby the color of the emitted light had a color coordinate of (Cx 0.18, Cy 0.40) (bluish green, Example 5) and (Cx 0.40, Cy 0.20) (magenta, Example 6). The spectra of light emitted from the color conversion layer is shown in FIGS. 13A to 13B, respectively. In addition, from each of the spectrums, a first area percentage and a second area percentage are calculated and shown in Table 4.

Comparative Examples 5 to 6

Figure 14A:
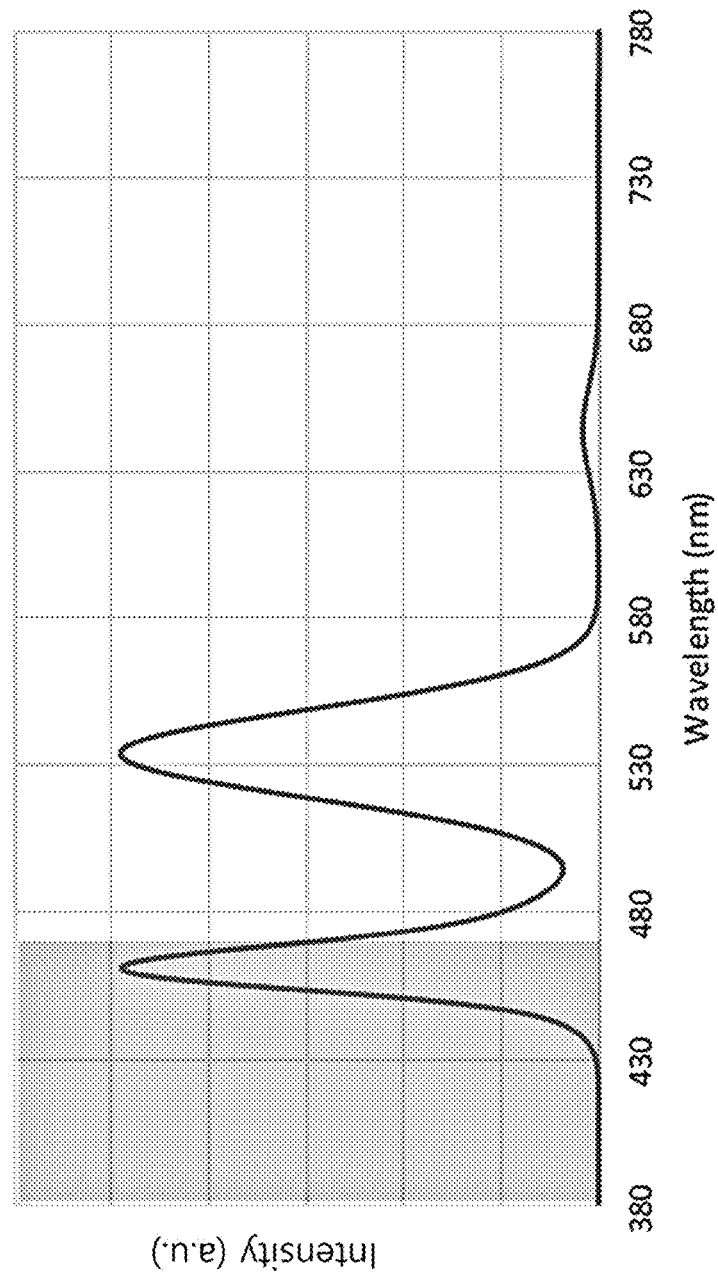
FIGS. 14A to 14B and 15 show emission spectra of the display panels of Comparative Examples 5 to 6 and Additional Example 7, respectively.
Figure 14B:
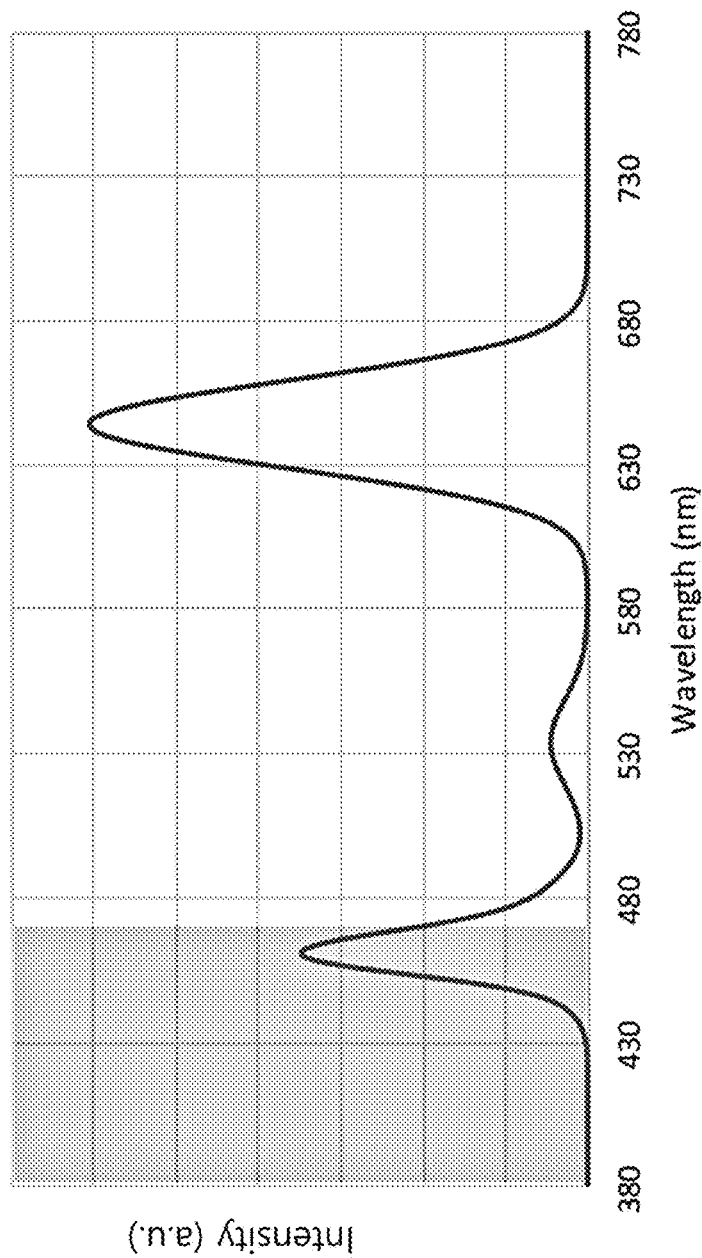

A display panel was manufactured in substantially the same manner as in Example 1 except for not using the third color region. The color conversion panel and the light emitting panel were controlled to change a ratio among blue, green, and red spectra, whereby the color of the emitted light had a color coordinate (Cx 0.18, Cy 0.40) (bluish green, Comparative Example 5) and (Cx 0.40, Cy 0.20) (magenta, Comparative Example 6), where the spectra of light emitted from the color conversion layer are shown in FIGS. 14A to 14B. In addition, from each of the spectrums, a first area percentage and a second area percentage thereof are calculated and shown in Table 4.

Additional Example 7

Figure 15:
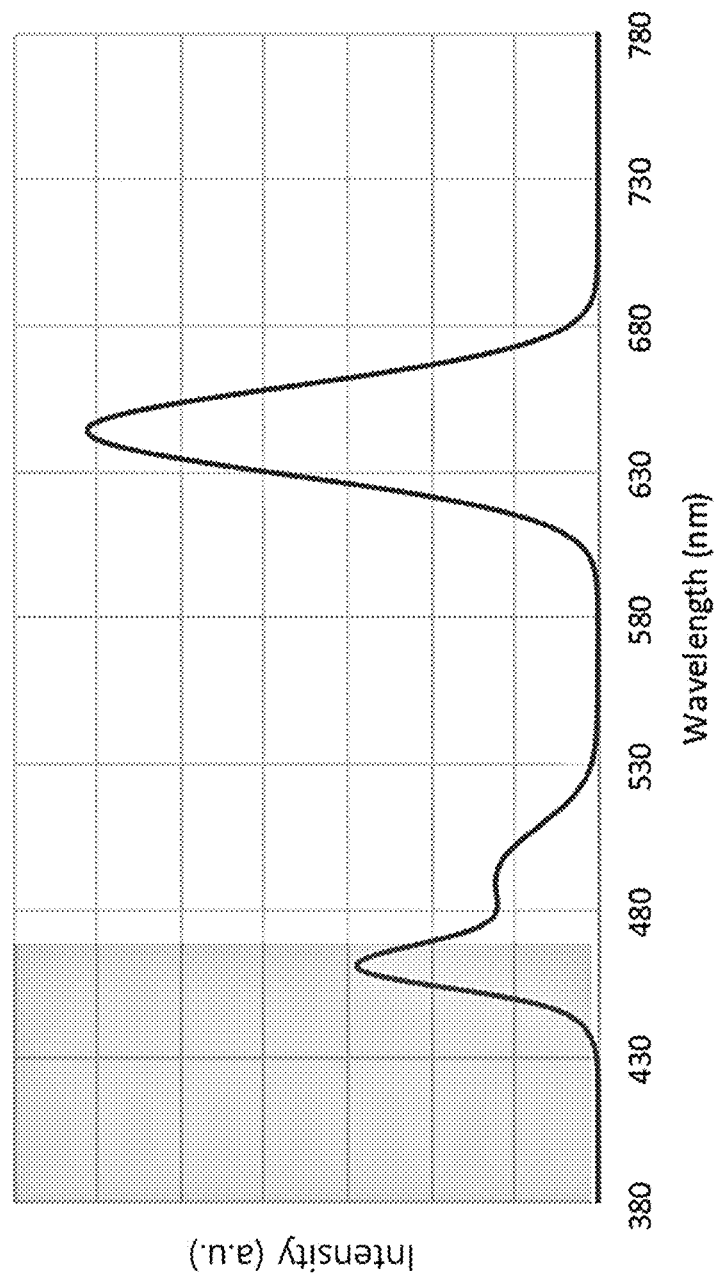

A display panel was manufactured in the same manner as in Example 1 except that the emission peak wavelength of the third light was changed into 490 nm. The manufactured display panel was controlled so that the light emitted from the color conversion layer represented a color coordinate of (Cx 0.40, Cy 0.20) (magenta), where the spectrum of the light emitted from the color conversion layer was shown in FIG. 15 and was used to calculate first and second area percentages, which are provided in Table 4.

TABLE 4

| | First area percentage | Second area percentage |
|---|---|---|
| Example 5 | 43.7% | about 9% |
| Example 6 | 69.3% | about 13% |
| Comparative Example 5 | 84.2% | about 29% |
| Comparative Example 6 | 84.2% | about 20% |
| Additional Example 7 | 78.8% | about 16% |

Referring to the results of Table 4, the display panels of the examples may express a color of a desired color coordinate as well as have a significantly lower blue light fraction than the display panels of the comparative examples.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising a light emitting panel and a color conversion panel,
wherein the color conversion panel comprises a color conversion layer comprising a plurality of color regions, and a partition wall which defines the plurality of color regions,
the light emitting panel provides incident light to each of the plurality of color regions,
the plurality of color regions comprises a first color region, a second color region, a third color region, and a fourth color region,
the first color region comprises a first composite comprising a first matrix and first semiconductor nanoparticles dispersed in the first matrix,
the first semiconductor nanoparticles convert the incident light into a first light,
the second color region comprises a second composite comprising a second matrix and second semiconductor nanoparticles dispersed in the second matrix,
the second semiconductor nanoparticles convert the incident light into a second light,
the third color region comprises a third composite comprising a third matrix and third semiconductor nanoparticles dispersed in the third matrix, the third semiconductor nanoparticles convert the incident light into a third light,
the fourth color region emits a fourth light,
the first semiconductor nanoparticles, the second semiconductor nanoparticles, and the third semiconductor nanoparticles do not comprise cadmium, lead, or a combination thereof,
an emission peak wavelength of the first light is greater than or equal to about 600 nm and less than or equal to about 650 nm,
an emission peak wavelength of the second light is greater than or equal to about 500 nm and less than or equal to about 560 nm,
an emission peak wavelength of the third light is greater than about 470 nm and less than about 500 nm,
an emission peak wavelength of the fourth light is greater than or equal to about 440 nm and less than or equal to about 470 nm,
the color conversion layer is configured to emit a predetermined light,
a color of the predetermined light comprises a first region of Cx of about 0.26 to about 0.35 and Cy of about 0.27 to about 0.35 in CIE 1931 color coordinates, and
in an emission spectrum of the predetermined light having a color in the first region, a first area percentage is less than or equal to about 65%, wherein the first area percentage is defined by the following formula: [A/B]×100(%),
wherein
A denotes an area of a region having a wavelength of less than or equal to about 470 nm in the emission spectrum, and
B denotes an area of a region having a wavelength of less than or equal to about 480 nm in the emission spectrum.

2. The display panel of claim 1, wherein
in the emission spectrum of the predetermined light having the color in the first region, a second area percentage is less than or equal to about 19%, wherein the second area percentage is defined by the following formula: [A/C]×100%,
wherein
A denotes an area of a region having a wavelength of less than or equal to about 470 nm in the emission spectrum, and
C denotes a total area of the emission spectrum.

3. The display panel of claim 2, wherein
the second area percentage is less than or equal to about 15%.

4. The display panel of claim 1, wherein
each of the plurality of color regions is optically isolated by the partition wall.

5. The display panel of claim 1, wherein
the emission peak wavelength of the third light is greater than or equal to about 475 nm and less than or equal to about 485 nm.

6. The display panel of claim 1, wherein
the emission peak wavelength of the fourth light is greater than or equal to about 450 nm and less than or equal to about 465 nm.

7. The display panel of claim 1, wherein
a difference between the emission peak wavelength of the third light and the emission peak wavelength of the fourth light is less than or equal to about 39 nm.

8. The display panel of claim 1, wherein
the emission peak wavelength of the third light is greater than or equal to about 475 nm and less than or equal to about 485 nm,
the emission peak wavelength of the fourth light is greater than or equal to about 455 nm and less than or equal to about 465 nm, and
a difference between the emission peak wavelength of the third light and the emission peak wavelength of the fourth light is less than or equal to about 30 nm.

9. The display panel of claim 1, wherein
the emission peak wavelength of the fourth light is substantially the same as an emission peak wavelength of the incident light.

10. The display panel of claim 1, wherein
in the first region, Cx is in a range of about 0.28 to about 0.32 and Cy is in a range of about 0.28 to about 0.33.

11. The display panel of claim 1, wherein
a full width at half maximum of the first light is greater than or equal to about 5 nm and less than or equal to about 45 nm,
a full width at half maximum of the second light is greater than or equal to about 5 nm and less than or equal to about 45 nm, and
a full width at half maximum of the third light is greater than or equal to about 5 nm and less than or equal to about 45 nm.

12. The display panel of claim 1, wherein
a full width at half maximum of the third light is greater than or equal to about 26 nm.

13. The display panel of claim 1, wherein
the first area percentage is less than or equal to about 55%.

14. The display panel of claim 1, wherein
the first area percentage is less than or equal to about 50%.

15. The display panel of claim 1, wherein
luminance intensity at an intersection of a normalized emission spectrum of the third light and a normalized emission spectrum of the second light is less than or equal to about 0.5.

16. The display panel of claim 1, wherein
luminance intensity at an intersection of a normalized emission spectrum of the third light and a normalized emission spectrum of the second light is less than or equal to about 0.4.

17. The display panel of claim 1, wherein
an emission spectrum of the color conversion layer does not exhibit an additional emission peak having an emission peak wavelength of greater than about 580 nm and less than about 600 nm, and wherein the additional emission peak has a full width at half maximum of greater than or equal to about 5 nm less than or equal to about 50 nm.

18. The display panel of claim 1, wherein
the first semiconductor nanoparticles, the second semiconductor nanoparticles, and the third semiconductor nanoparticles comprise each independently a Group II-VI compound, a Group III-V compound, a Group IV-VI compound, a Group IV element or compound, a Group compound, a Group I-II-IV-VI compound, or a combination thereof.

19. The display panel of claim 1, wherein
the fourth region comprises a fourth composite optionally comprising metal oxide particulates, and
the first composite, the second composite, the third composite, or a combination thereof further comprises metal oxide particulates.

20. A display device comprising the display panel of claim 1.

* * * * *